(12) United States Patent
Harada et al.

(10) Patent No.: US 12,106,796 B2
(45) Date of Patent: Oct. 1, 2024

(54) METHOD FOR MANUFACTURING SEMICONDUCTOR ELEMENT-INCLUDING MEMORY DEVICE

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 153 days.

(21) Appl. No.: 17/994,922

(22) Filed: Nov. 28, 2022

(65) Prior Publication Data

US 2023/0093308 A1    Mar. 23, 2023

Related U.S. Application Data

(63) Continuation-in-part of application No. 17/478,282, filed on Sep. 17, 2021, now Pat. No. 11,776,620, and
(Continued)

(51) Int. Cl.
*G11C 5/06* (2006.01)
*G11C 11/409* (2006.01)
*H10B 12/00* (2023.01)

(52) U.S. Cl.
CPC .............. *G11C 11/409* (2013.01); *G11C 5/06* (2013.01); *H10B 12/20* (2023.02); *H10B 12/50* (2023.02)

(58) Field of Classification Search
CPC ............ G11C 11/406; G11C 11/4076; G11C 11/4091; H10B 12/50; H10B 12/00; H01L 29/66666
(Continued)

(56) References Cited

U.S. PATENT DOCUMENTS

2003/0111681 A1    6/2003  Kawanaka
2006/0049444 A1    3/2006  Shino
(Continued)

FOREIGN PATENT DOCUMENTS

JP    H02-188966 A    7/1990
JP    H03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's" IEEE Transaction on Electron Devices, vol. 38, No. 3, pp. 573-578 (1991).
(Continued)

*Primary Examiner* — Michael T Tran
(74) *Attorney, Agent, or Firm* — Crowell & Moring LLP

(57) ABSTRACT

An $N^+$ layer 11a and $N^+$ layers 13a to 13d that are disposed on both ends of Si pillars 12a to 12d standing on a substrate 10 in a vertical direction, a TiN layer 18a that surrounds a gate $HfO_2$ layer 17a surrounding the Si pillars 12a to 12d and that extends between the Si pillars 12a and 12b, a TiN layer 18b that surrounds the gate $HfO_2$ layer 17a and that extends between the Si pillars 12c and 12d, a TiN layer 26a that surrounds a gate $HfO_2$ layer 17b surrounding the Si pillars 12a to 12d and that extends between the Si pillars 12a and 12b, and a TiN layer 26b that surrounds the gate $HfO_2$ layer 17b and that extends between the Si pillars 12c and 12d are formed. Voltages applied to the $N^+$ layers 11a and 13a to 13d and the TiN layers 18a, 18b, 26a, and 26b are controlled to perform a data write operation of retaining, inside the Si pillars 12a to 12d, a group of positive holes generated by an impact ionization phenomenon and a data erase operation of
(Continued)

discharging the group of positive holes from the inside of the Si pillars 12a to 12d.

14 Claims, 21 Drawing Sheets

Related U.S. Application Data a continuation-in-part of application No. PCT/JP2021/000281, filed on Jan. 7, 2021, said application No. 17/478,282 is a continuation of application No. PCT/JP2020/048952, filed on Dec. 25, 2020.

(58) Field of Classification Search
USPC .................................. 365/189.011, 230.05
See application file for complete search history.

(56) References Cited

U.S. PATENT DOCUMENTS

| | | | |
|---|---|---|---|
| 2008/0137394 | A1 | 6/2008 | Shimano et al. |
| 2008/0212366 | A1 | 9/2008 | Ohsawa |
| 2017/0301679 | A1* | 10/2017 | Masuoka .......... H01L 29/42392 |
| 2019/0043869 | A1* | 2/2019 | Masuoka ................ H10B 43/10 |
| 2019/0157166 | A1* | 5/2019 | Masuoka ............ H01L 27/1203 |
| 2020/0258897 | A1* | 8/2020 | Yan ..................... H01L 21/0217 |
| 2021/0210506 | A1* | 7/2021 | Yan ........................ H10B 43/50 |
| 2021/0265372 | A1* | 8/2021 | Kanakamedala ...... H10B 41/27 |
| 2021/0265385 | A1* | 8/2021 | Rajashekhar .......... H10B 43/10 |
| 2022/0285367 | A1* | 9/2022 | Fackenthal ..... H01L 21/823871 |
| 2024/0206150 | A1* | 6/2024 | Sakui .................. G11C 11/4096 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Song, J. Kim, Y.C. Oh, Y. Hwang, H. Hong, G. Jin, and C. Chung: "Novel $4F^2$ DRAM Cell with Vertical Pillar Transistor(VPT)," 2011 Proceeding of the European Solid-State Device Research Conference, (2011).
H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).
K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electrons," IEEE Electron Device Letter, vol. 31, No. 5, pp. 405-407 (2010).
J. Wan, L. Royer, A. Zaslavsky, and S. Cristoloveanu: "A Compact Capacitor-Less High-Speed DRAM Using Field Effect-Controlled Charge Regeneration," Electron Device Letters, vol. 33, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).
E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Pagers, T17-5, T230-T231, Jun. 2017.
H. Jiang, N. Xu, B. Chen, L. Zeng, Y. He, G. Du, X. Liu and X. Zhang: "Experimental investigation of self heating effect (SHE) in multiple-fin SOI FinFETs," Semicond. Sci. Technol. 29 (2014) 115021 (7pp).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006.
F. Morishita, H. Noda, I. Hayashi, T. Gyohten, M. Okamoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007).
International Search Report, PCT/ISA/220, in Application No. PCT/JP2021/000281, dated Feb. 22, 2021, 5 pages.
Written Opinion, PCT/ISA/237, in Application No. PCT/JP2021/000281, dated Feb. 22, 2021, 3 pages.

\* cited by examiner

Vb: BUILT-IN VOLTAGE 0.7 V

Vb: BUILT-IN VOLTAGE 0.7 V $$C_{FB} = C_{PL} + C_{WL} + C_{BL} + C_{SL}$$

$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

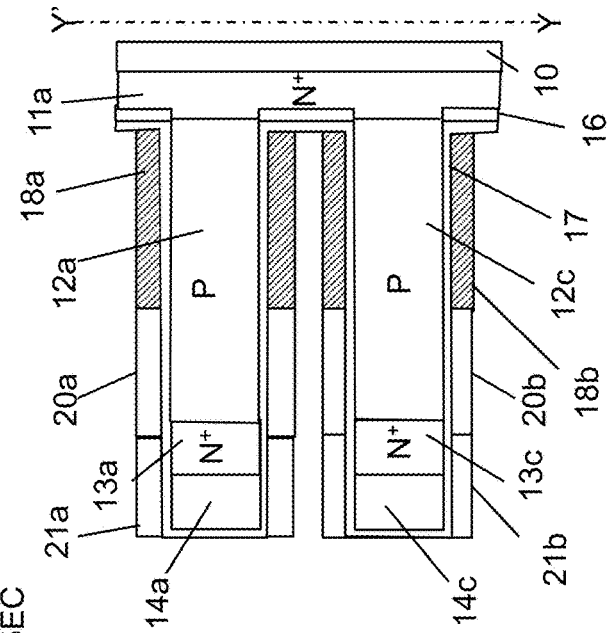
FIG. 5EC
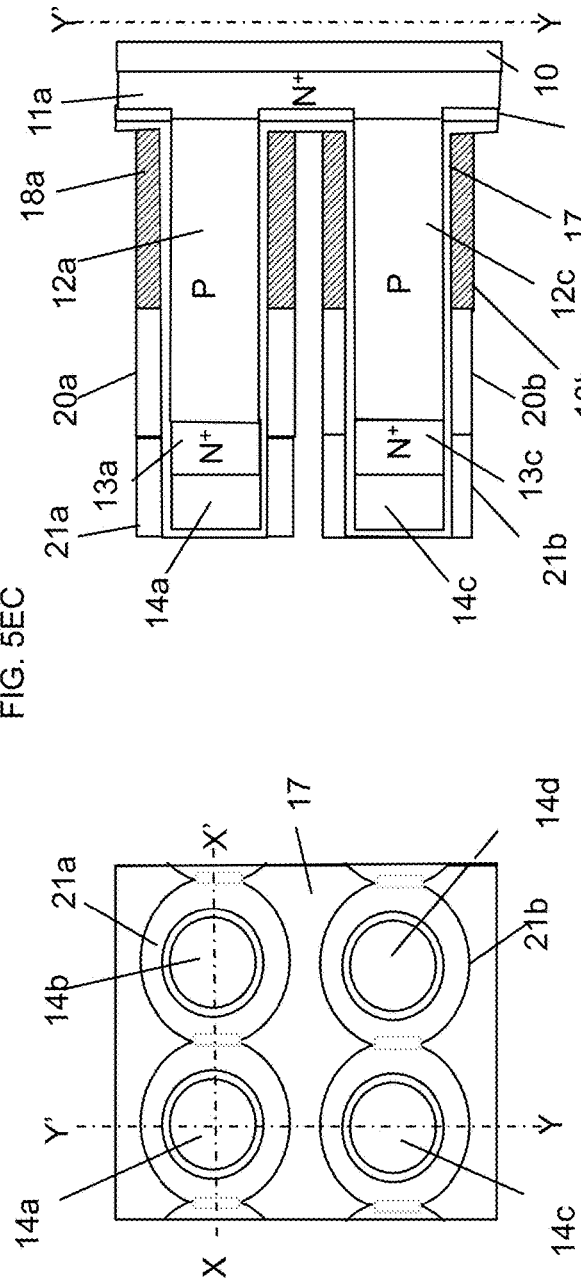
FIG. 5EA
FIG. 5EB

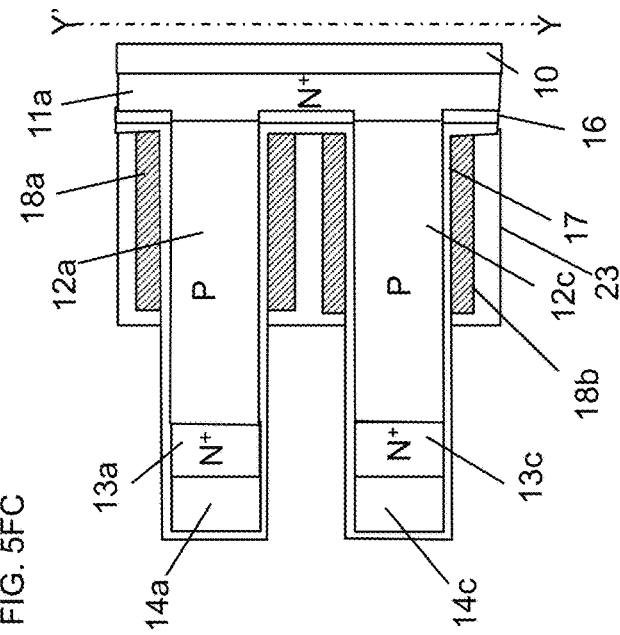
FIG. 5FA
FIG. 5FB
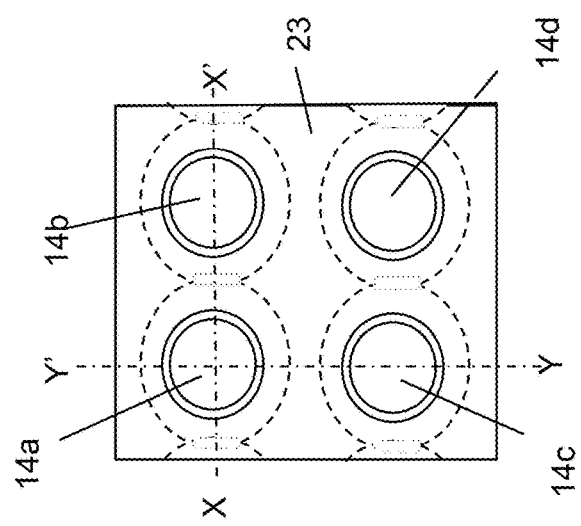
FIG. 5FC

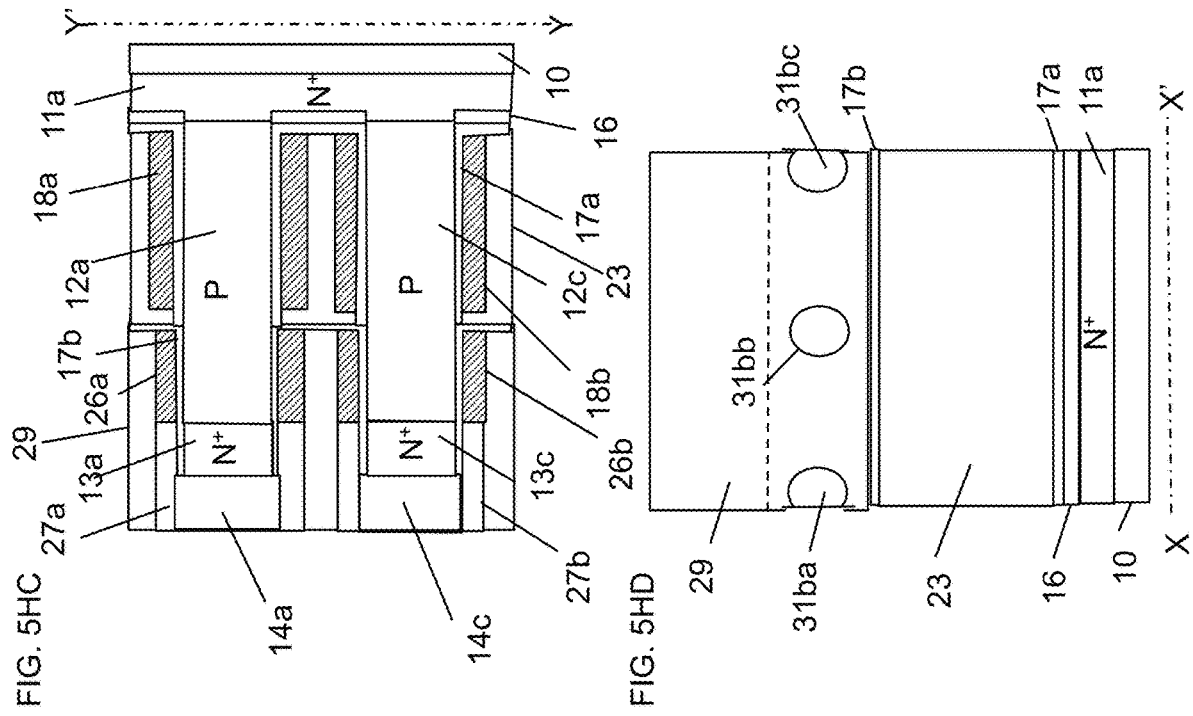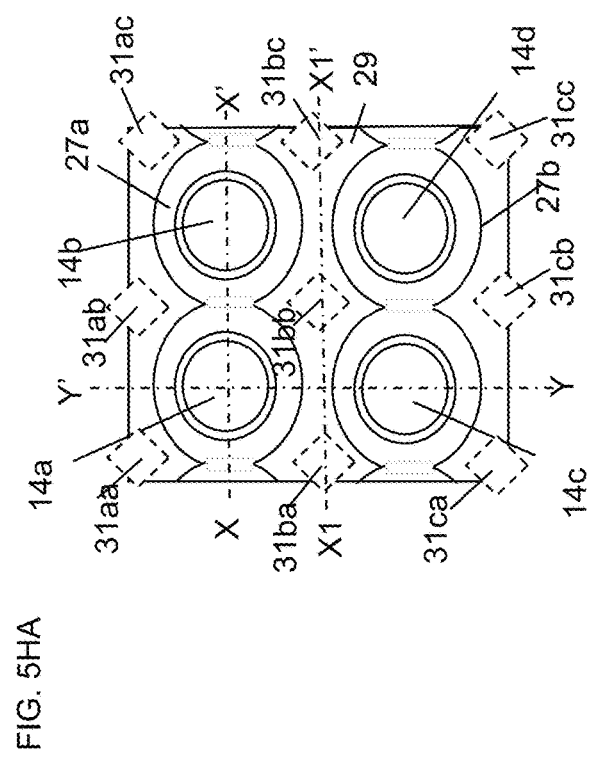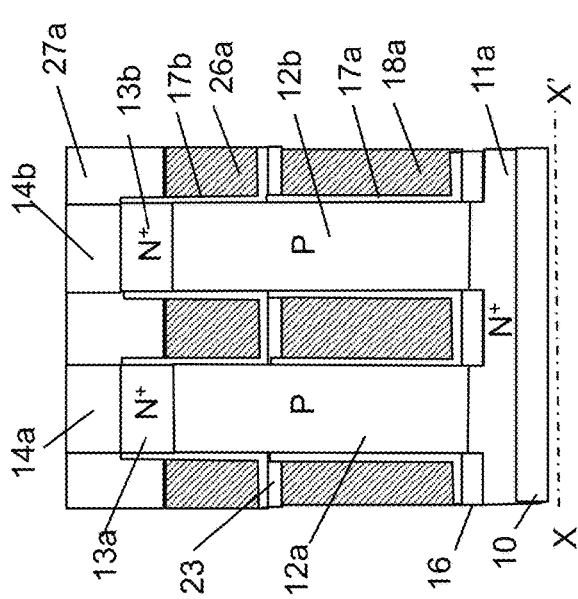

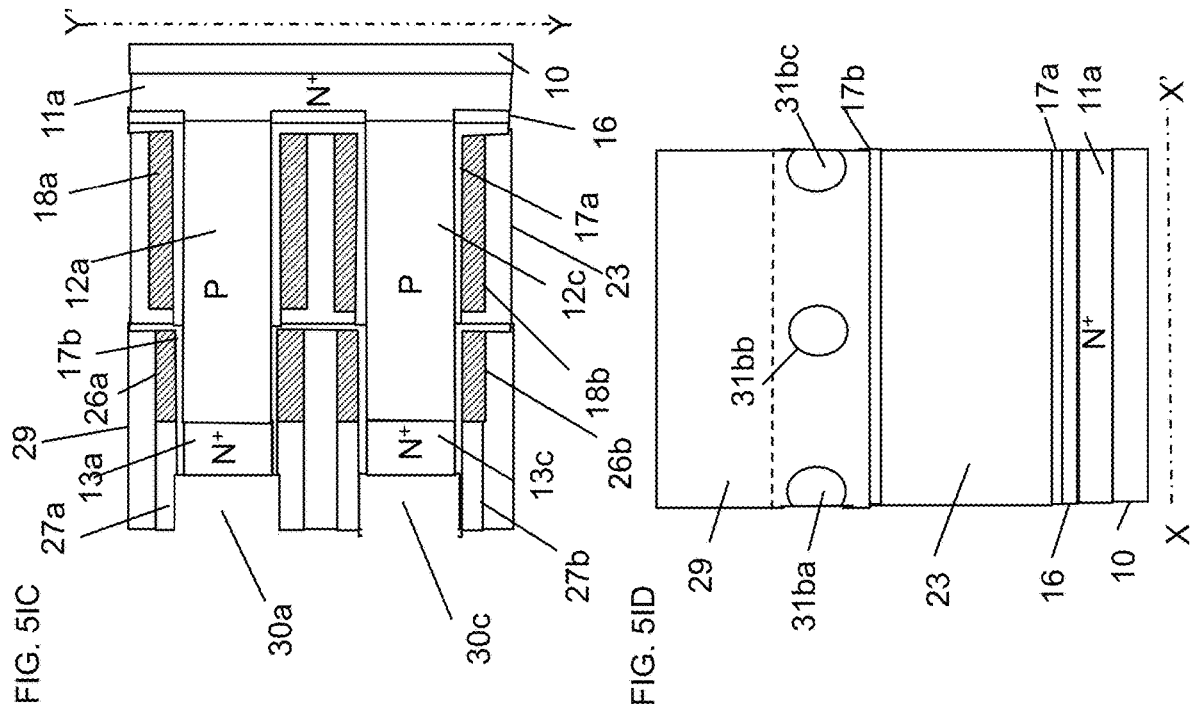
FIG. 5IC
FIG. 5ID
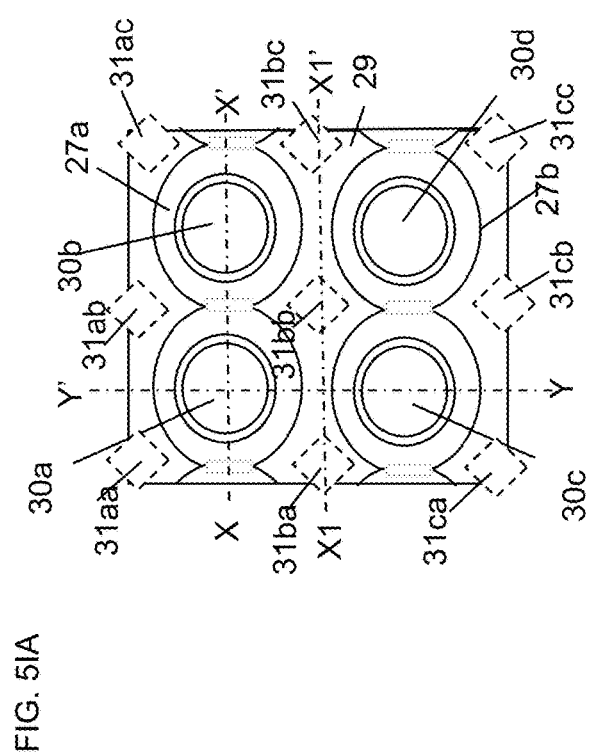
FIG. 5IA
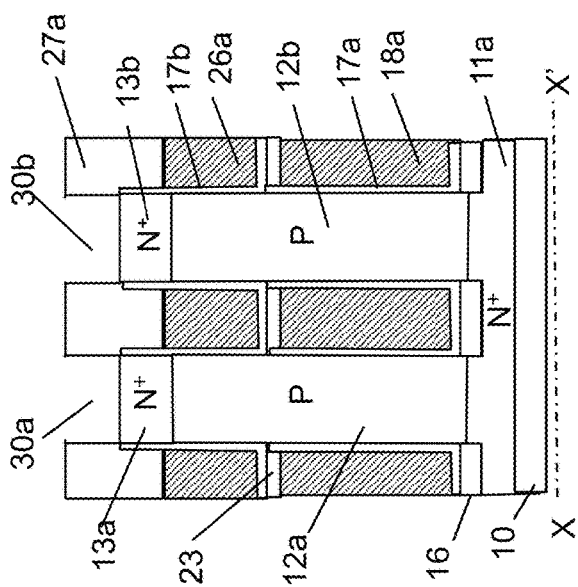
FIG. 5IB

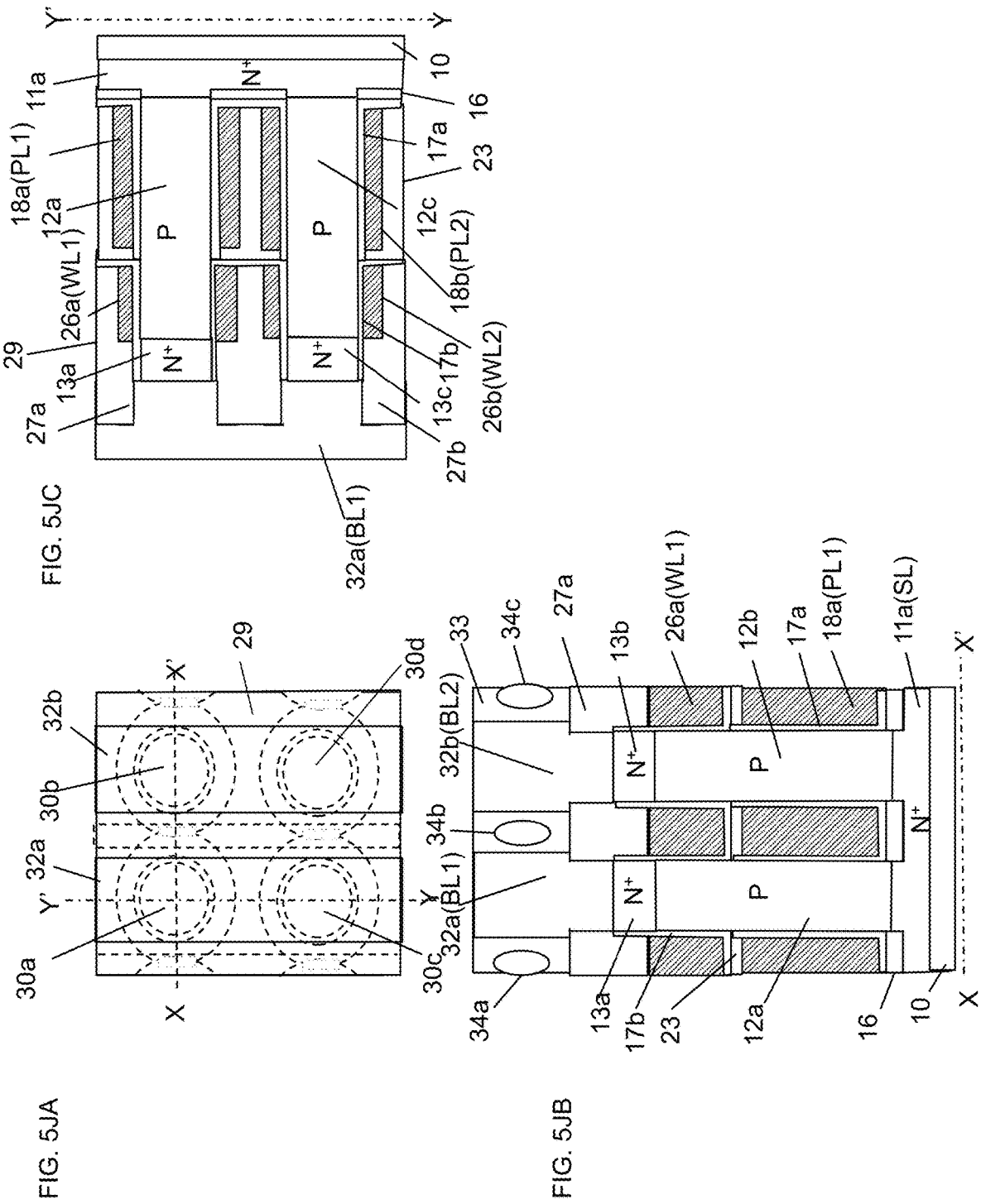

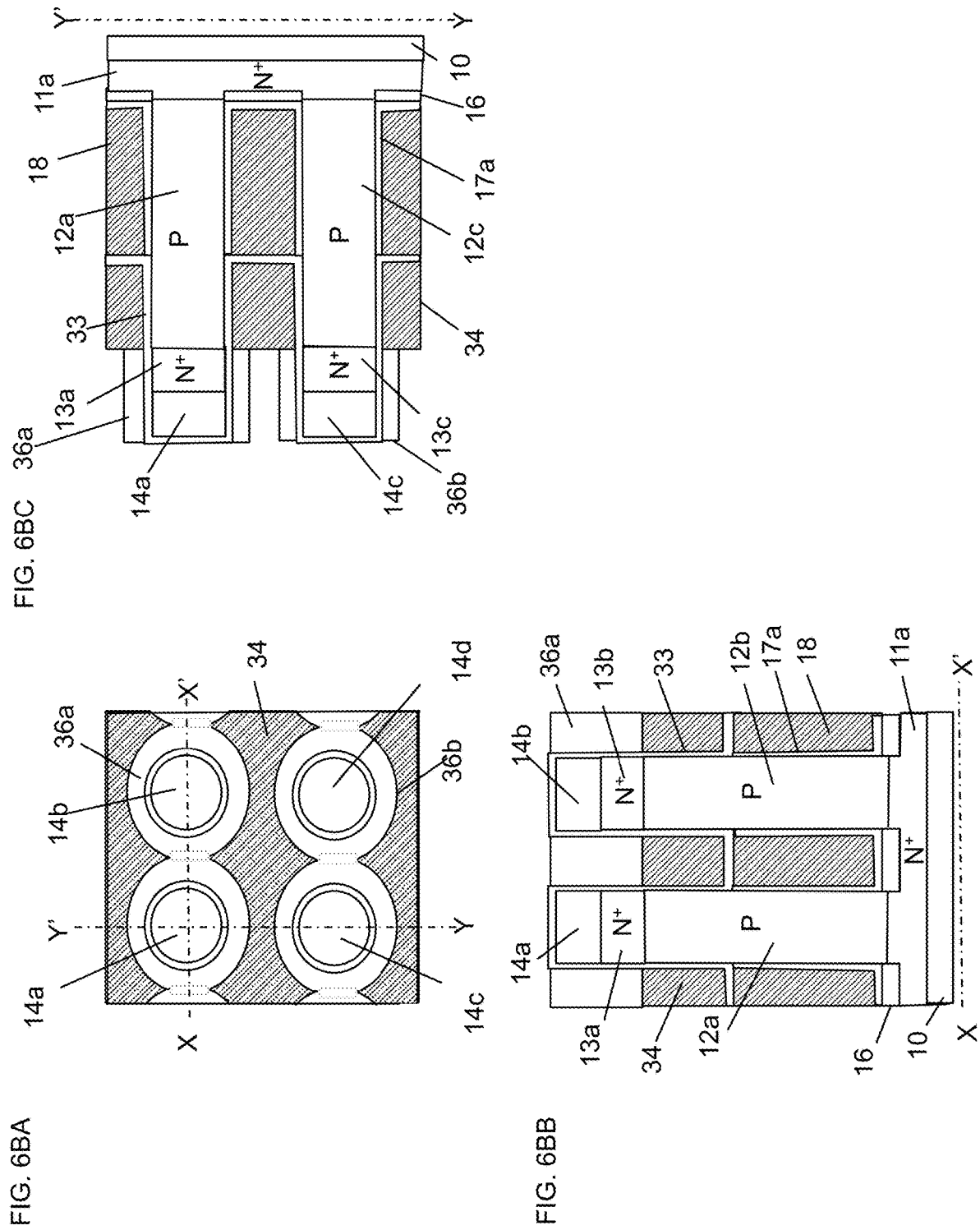

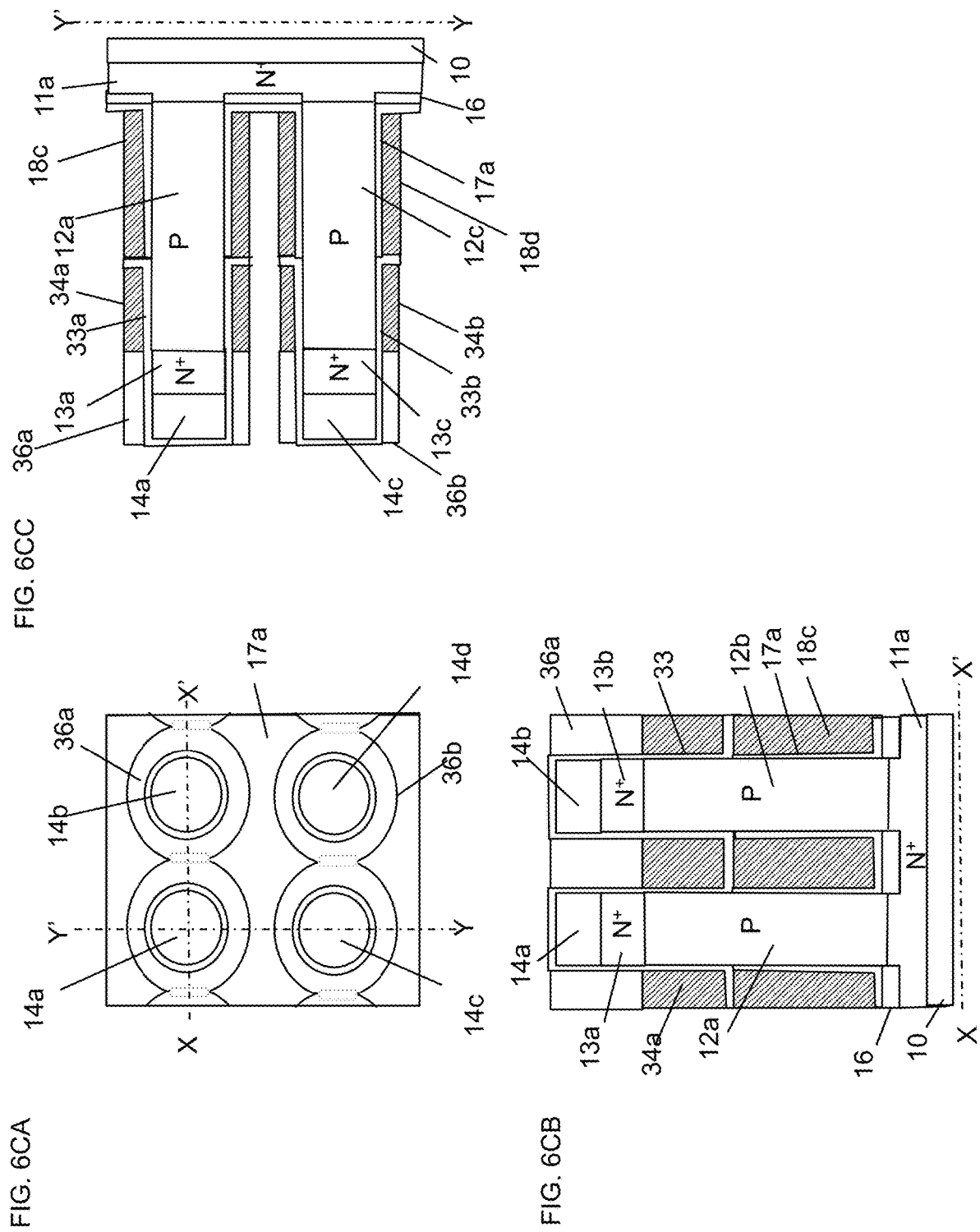

$$C_{FB} = C_{WL} + C_{BL} + C_{SL} \quad \text{EXPRESSION (2)}$$

$$\Delta V_{FB} = V_{FB2} - V_{FB1}$$

$$= \frac{C_{WL}}{C_{WL} + C_{BL} + C_{SL}} \times V_{ProgWL} \quad \text{EXPRESSION (3)}$$

$$\beta = \frac{C_{WL}}{C_{WL} + C_{BL} + C_{SL}} \quad \text{EXPRESSION (4)}$$

METHOD FOR MANUFACTURING SEMICONDUCTOR ELEMENT-INCLUDING MEMORY DEVICE

RELATED APPLICATIONS

The present application is a continuation-in-part application of Ser. No. 17/478,282 filed Sep. 17, 2021, now U.S. Pat. No. 11,776,620, which is a continuation of PCT/JP2020/048952, filed on Dec. 25, 2020. The present application is also a continuation in-part application of PCT/JP2021/000281, filed on Jan. 7, 2021, the entire contents of which are incorporated herein by reference.

BACKGROUND OF THE INVENTION

1. Field of the Invention

The present invention relates to a method for manufacturing a semiconductor element-including memory device.

2. Description of the Related Art

In recent years, there has been a demand for an increase in the degree of integration and a higher performance of memory devices in the development of large scale integration (LSI) technologies.

Typical planar metal oxide semiconductor (MOS) transistors have a channel that extends in a horizontal direction along the upper surface of a semiconductor substrate. In contrast, surrounding gate transistors (SGTs) have a channel that extends in a direction perpendicular to the upper surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs enable an increase in the density of semiconductor devices compared with planar MOS transistors. Such SGTs can be used as selection transistors to achieve an increase in the degree of integration of memories, such as a dynamic random access memory (DRAM) (refer to, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected; a phase change memory (PCM) (refer to, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance-change element is connected; a resistive random access memory (RRAM) (refer to, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)); and a magneto-resistive random access memory (MRAM) (refer to, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) in which the orientation of magnetic spins is changed with a current to change the resistance. Furthermore, a known example is a DRAM memory cell (refer to J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012)) that is constituted by a single MOS transistor and that includes no capacitor. The present application relates to a dynamic flash memory that can be constituted only by a MOS transistor and that includes neither a resistance-change element nor a capacitor.

FIGS. 7A, 7B, 7C, and 7D illustrate a write operation of the above-mentioned DRAM memory cell constituted by a single MOS transistor and including no capacitor, FIGS. 8A and 8B illustrate a problem in the operation of the DRAM memory cell, and FIGS. 9A to 9C illustrate a read operation of the DRAM memory cell (refer to J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOT", IEEE JSSC, Vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain-Leakage (GIDL) Current for Low-Power and High-Speed Embedded Memory", IEEE IEDM (2006)).

FIGS. 7A, 7B, 7C, and 7D illustrate a write operation of a DRAM memory cell. FIG. 7A illustrates a "1" write state. Here, the memory cell is formed in a SOT substrate 100 and constituted by a source N$^+$ layer 103 to which a source line SL is connected, a drain N$^+$ layer 104 to which a bit line BL is connected, a gate conductive layer 105 to which a word line WL is connected, and a floating body 102 of a MOS transistor 110a. The memory cell of a DRAM is constituted by the single MOS transistor 110a and includes no capacitor. A SiO$_2$ layer 101 of the SOT substrate is in contact with the floating body 102 directly under the floating body 102. When writing of "1" is performed in the memory cell constituted by the single MOS transistor 110a, the MOS transistor 110a is operated in the saturated region. That is, a channel 107 for electrons extending from the source N$^+$ layer 103 has a pinch-off point 108 and does not reach the drain N$^+$ layer 104 to which the bit line BL is connected. When a high voltage is applied to both the bit line BL connected to the drain N$^+$ layer 104 and the word line WL connected to the gate conductive layer 105, and the MOS transistor 110a is operated at a gate voltage that is about ½ of the drain voltage, the electric field strength becomes maximum at the pinch-off point 108 that is located near the drain N$^+$ layer 104. As a result, accelerated electrons flowing from the source N$^+$ layer 103 toward the drain N$^+$ layer 104 collide with the lattice of Si, and electron-positive hole pairs are generated by the kinetic energy lost in the collision (impact ionization phenomenon). Most of the generated electrons (not illustrated) reach the drain N$^+$ layer 104. Only a small number of very hot electrons jump over a gate oxide film 109 and reach the gate conductive layer 105. Positive holes 106 that have generated at the same time charge the floating body 102. In this case, the generated positive holes contribute to an increment of the majority carrier because the floating body 102 is made of P-type Si. When the floating body 102 is filled with the generated positive holes 106 and the voltage of the floating body 102 becomes higher than the voltage of the source N+ layer 103 by Vb or more, positive holes that are further generated are discharged to the source N+ layer 103. Here, Vb is a built-in voltage of the PN junction between the source N+ layer 103 and the floating body 102 of a P layer and is about 0.7 V. FIG. 7B illustrates a state in which the floating body 102 is charged to saturation with the generated positive holes 106.

Next, a "0" write operation of a memory cell 110 will be described with reference to FIG. 7C. A memory cell 110a in which "1" is written and a memory cell 110b in which "0" is written are present at random with respect to a common selected word line WL. FIG. 7C illustrates a state in which the write state is changed from a "1" write state to a "0" write state. At the time of writing "0", the voltage of the bit line BL is set to a negative bias, and the PN junction between the drain N+ layer 104 and the floating body 102 of the P layer is forward biased. As a result, positive holes 106 that are generated in advance in the floating body 102 in the previous cycle flow into the drain N+ layer 104 connected to the bit line BL. When the write operation is finished, a state of two memory cells, namely, the memory cell 110a filled with the generated positive holes 106 as illustrated in FIG. 7B and the memory cell 110b in which the generated positive holes are discharged as illustrated in FIG. 7C, is formed. The potential of the floating body 102 of the memory cell 110a filled with the positive holes 106 becomes higher than the potential of the floating body 102 in which the generated positive holes are not present. Accordingly, the threshold voltage of the memory cell 110a becomes lower than the threshold voltage of the memory cell 110b. This state is illustrated in FIG. 7D.

Next, a problem in the operation of the memory cell constituted by a single MOS transistor will be described with reference to FIGS. 8A and 8B. As illustrated in FIG. 8A, a capacitance $C_{FB}$ of the floating body 102 is equal to the sum of a capacitance $C_{WL}$ between the gate to which the word line is connected and the floating body 102, a junction capacitance $C_{SL}$ of the PN junction between the source N+ layer 103 to which the source line is connected and the floating body 102, and a junction capacitance $C_{BL}$ of the PN junction between the drain N+ layer 104 to which the bit line is connected and the floating body 102 and is expressed as follows:

$$C_{FB} = C_{WL} + C_{BL} + C_{SL} \quad (2)$$

Accordingly, when a word line voltage $V_{WL}$ fluctuates at the time of writing, the voltage of the floating body 102 serving as a storage node (contact point) of the memory cell is also affected by this fluctuation. This state is illustrated in FIG. 8B. When the word line voltage $V_{WL}$ increases from 0 V to $V_{ProgWL}$ at the time of writing, a voltage $V_{FB}$ of the floating body 102 is increased from a voltage $V_{FB1}$ in the initial state before the change in the word line voltage to $V_{FB2}$ by a capacitive coupling with the word line. The amount $\Delta V_{FB}$ of change in the voltage is expressed as follows:

$$\Delta V_{FB} = V_{FB2} - V_{FB1} = C_{WL}/(C_{WL} + C_{BL} + C_{SL}) \times V_{ProgWL} \quad (3)$$

Here, in the following expression, β is referred to as a coupling ratio:

$$\beta = C_{WL}/(C_{WL} + C_{BL} + C_{SF}) \quad (4)$$

In such a memory cell, $C_{WL}$ has a large contribution ratio, and, for example, $C_{WL}:C_{BF}:C_{SF}=8:1:1$. In this case, β=0.8. When the voltage of the word line changes, for example, from 5 V at the time of writing to 0 V after completion of writing, the floating body 102 is subjected to fluctuation noise of as large as 5 V×β=4 V due to the capacitive coupling between the word line and the floating body 102. Accordingly, there is a problem in that a sufficient margin of the potential difference between the "1" potential and the "0" potential of the floating body at the time of writing is not provided.

FIGS. 9A, 9B, and 9C illustrate a read operation. FIG. 9A illustrates the "1" write state, and FIG. 9B illustrates the "0 write state. Actually, however, even in the state where Vb is written in the floating body 102 in "1" writing, when the voltage of the word line returns to 0 V in the completion of writing, the voltage of the floating body 102 is lowered to a negative bias. When "0" is written, the voltage of the floating body 102 is further lowered to a negative bias, and thus a sufficiently large margin of the potential difference between "1" and "0" cannot be provided at the time of writing. This small operation margin is a big problem of this DRAM memory cell. In addition, it is desirable to achieve a higher density of this DRAM memory cell.

SUMMARY OF THE INVENTION

In a capacitor-less single-transistor DRAM (gain cell), the capacitive coupling between a word line and a floating body is large. Thus, there may be a problem in that when the potential of the word line is fluctuated at the time of data reading or at the time of data writing, the fluctuation of the potential is directly transmitted as noise to the floating body. This results in a problem of reading error or rewriting error of storage data and makes it difficult to put a capacitor-less single-transistor DRAM (gain cell) into practical use. Furthermore, it is necessary not only to address the problems described above but also to achieve a higher density of a memory cell.

To address the problems described above, an aspect of the present invention provides a method for manufacturing a pillar-shaped semiconductor element-including memory device that controls voltages applied to a first gate conductor layer, a second gate conductor layer, a third gate conductor layer, a fourth gate conductor layer, a first impurity region, and a second impurity region to perform a data write operation, a data read operation, and a data erase operation, the method including the steps of: forming a first semiconductor pillar and a second semiconductor pillar standing on a substrate in a vertical direction and disposed adjacent to each other in a first direction in plan view, and a third semiconductor pillar and a fourth semiconductor pillar standing on the substrate in the vertical direction, having centers on a second line parallel to a first line passing through centers of the first semiconductor pillar and the second semiconductor pillar, and disposed adjacent to each other; forming a first gate insulating layer surrounding lower portions of the first to fourth semiconductor pillars and a second gate insulating layer surrounding upper portions of the first to fourth semiconductor pillars, a first gate conductor layer that surrounds the first gate insulating layer surrounding the first semiconductor pillar and the second semiconductor pillar and that extends between the first semiconductor pillar and the second semiconductor pillar, a second gate conductor layer that surrounds the first gate insulating layer surrounding the third semiconductor pillar and the fourth semiconductor pillar and that extends between the third semiconductor pillar and the fourth semiconductor pillar, a third gate conductor layer that surrounds the second gate insulating layer surrounding the first semiconductor pillar and the second semiconductor pillar and that extends between the first semiconductor pillar and the second semiconductor pillar, and a fourth gate conductor layer that surrounds the second gate insulating layer surrounding the third semiconductor pillar and the fourth semiconductor pillar and that extends between the third semiconductor pillar and the fourth semiconductor pillar; before or after the forming of the first to fourth semiconductor pillars, forming the first impurity region connected to bottom portions of the first to fourth semiconductor pillars; before or after the forming of the first to fourth semiconductor pillars, forming the second impurity region in a top portion of each of the first to fourth semiconductor pillars; and forming a first wiring conductor layer connected to the second impurity region of each of the top portions of the first semiconductor pillar and the third semiconductor pillar, and a second wiring conductor layer connected to the second impurity region of each of the top portions of the second semiconductor pillar and the fourth semiconductor pillar.

In the method for manufacturing a pillar-shaped semiconductor element-including memory device, in plan view, a first length may be smaller than a second length, where the first length represents a distance between two opposed points among points where two outer circumferential lines of the first gate insulating layers surrounding the first semiconductor pillar and the second semiconductor pillar intersect the first line joining the centers of the first semiconductor pillar and the second semiconductor pillar, and the second length represents a distance between two opposed points among points where two outer circumferential lines of the first gate insulating layers surrounding the first semiconductor pillar and the third semiconductor pillar intersect a third line joining the centers of the first semiconductor pillar and the third semiconductor pillar, the second length may be larger than twice a third length, where the third length represents a thickness of the first gate conductor layer surrounding the first semiconductor pillar on the third line, and the first length may be smaller than twice the third length.

The method for manufacturing a pillar-shaped semiconductor element-including memory device may further include the steps of: after the forming of the first gate insulating layer, forming, on an outer peripheral portion of the first gate insulating layer, a first conductor layer having an upper surface whose level corresponds to upper ends of the first gate conductor layer and the second gate conductor layer in the vertical direction; forming a first mask material layer disposed on the top portion of each of the first to fourth semiconductor pillars, a second mask material layer extending between the first semiconductor pillar and the second semiconductor pillar, and a third mask material layer extending between the third semiconductor pillar and the fourth semiconductor pillar and separated from the second mask material layer, the second and third mask material layers surrounding side surfaces of the first to fourth semiconductor pillars; and etching the first conductor layer using the first mask material layer, the second mask material layer, and the third mask material layer as a mask to form the first gate conductor layer and the second gate conductor layer.

The method for manufacturing a pillar-shaped semiconductor element-including memory device may further include the steps of: after the forming of the second gate insulating layer, forming, on an outer peripheral portion of the second gate insulating layer, a second conductor layer having an upper surface whose level is located near a lower end of the second impurity region in the vertical direction; forming a first mask material layer disposed on each of the top portions of the first to fourth semiconductor pillars, a fourth mask material layer extending between the first semiconductor pillar and the second semiconductor pillar, and a fifth mask material layer extending between the third semiconductor pillar and the fourth semiconductor pillar, the fourth and fifth mask material layers being disposed on the second conductor layer, surrounding a side surface of the first mask material layer and side surfaces of the first to fourth semiconductor pillars, and being separated from each other; and etching the second conductor layer using the first mask material layer, the fourth mask material layer, and the fifth mask material layer as a mask to form the third gate conductor layer and the fourth gate conductor layer.

The method for manufacturing a pillar-shaped semiconductor element-including memory device may further include the steps of: after the forming of the first gate insulating layer, forming, on an outer peripheral portion of the first gate insulating layer, a third conductor layer having an upper surface whose level corresponds to upper ends of the first gate conductor layer and the second gate conductor layer in the vertical direction; forming a second insulating layer on the third conductor layer; forming, on the second insulating layer, a fourth conductor layer having an upper surface whose level is close to a lower end of the second impurity region in the vertical direction, forming a first mask material layer disposed on each of the top portions of the first to fourth semiconductor pillars, a sixth mask material layer extending between the first semiconductor pillar and the second semiconductor pillar, and a seventh mask material layer extending between the third semiconductor pillar and the fourth semiconductor pillar, the sixth and seventh mask material layers being disposed on the fourth conductor layer, surrounding a side surface of the first mask material layer and side surfaces of the first to fourth semiconductor pillars, and being separated from each other; and etching the third conductor layer, the second insulating layer, and the fourth conductor layer using the first mask material layer, the sixth mask material layer, and the seventh mask material layer as a mask to form the first gate conductor layer, the second gate conductor layer, the third gate conductor layer, and the fourth gate conductor layer.

In the method for manufacturing a pillar-shaped semiconductor element-including memory device, the memory device may be formed such that a wiring line connected to the first impurity region is a source line, a wiring line connected to the second impurity region is a bit line, and one of a wiring line connected to the first gate conductor layer and the second gate conductor layer and a wiring line connected to the third gate conductor layer and the fourth gate conductor layer is a word line and the other is a first driving control line, and voltages may be applied to the source line, the bit line, the first driving control line, and the word line to selectively perform the data erase operation and the data write operation.

In the method for manufacturing a pillar-shaped semiconductor element-including memory device, the memory device may be formed such that a first gate capacitance between the first gate conductor layer and the first to fourth semiconductor pillars is larger than a second gate capacitance between the second gate conductor layer and the first to fourth semiconductor pillars.

The method for manufacturing a pillar-shaped semiconductor element-including memory device may include forming first holes between the third gate conductor layer and the fourth gate conductor layer in plan view.

The method for manufacturing a pillar-shaped semiconductor element-including memory device may include forming second holes between the first wiring conductor layer and the second wiring conductor layer.

In the method for manufacturing a pillar-shaped semiconductor element-including memory device, the second insulating layer may be formed from the second gate insulating layer connected to the first to fourth semiconductor pillars.

The method for manufacturing a pillar-shaped semiconductor element-including memory device may include a step of oxidizing upper surfaces or upper surfaces and side surfaces of the first gate conductor layer and the second gate conductor layer.

The method for manufacturing a pillar-shaped semiconductor element-including memory device may include: after the etching of the third conductor layer, the second insulating layer, and the fourth conductor layer using the first mask material layer, the sixth mask material layer, and the seventh mask material layer as a mask to form the first gate conductor layer, the second gate conductor layer, the third gate conductor layer, and the fourth gate conductor layer, forming third holes between the first and third gate conductor layers and the second and fourth gate conductor layers.

In the method for manufacturing a pillar-shaped semiconductor element-including memory device, the second insulating layer may be formed from the second gate insulating layer surrounding the first to fourth semiconductor pillars and connected to the top of the third conductor layer.

The method for manufacturing a pillar-shaped semiconductor element-including memory device may include the data write operation of retaining, inside any or all of the first to fourth semiconductor pillars, a group of positive holes formed by an impact ionization phenomenon or a gate-induced drain leakage current by controlling voltages applied to the first gate conductor layer, the second gate conductor layer, the third gate conductor layer, the fourth gate conductor layer, the first impurity region, and the second impurity region; and the data erase operation of discharging the group of positive holes from the inside of any or all of the first to fourth semiconductor pillars by controlling voltages applied to the first gate conductor layer, the second gate conductor layer, the third gate conductor layer, the fourth gate conductor layer, the first impurity region, and the second impurity region.

BRIEF DESCRIPTION OF THE DRAWINGS

FIGS. 5EA, 5EB, and 5EC are views for explaining the method for manufacturing the SGT-including memory device according to the first embodiment.

FIGS. 5FA, 5FB, and 5FC are views for explaining the method for manufacturing the SGT-including memory device according to the first embodiment.

FIGS. 5HA, 5HB, 5HC, and 5HD are views for explaining the method for manufacturing the SGT-including memory device according to the first embodiment.

FIGS. 5IA, 5IB, 5IC, and 5ID are views for explaining the method for manufacturing the SGT-including memory device according to the first embodiment.

FIGS. 5JA, 5JB, and 5JC are views for explaining the method for manufacturing the SGT-including memory device according to the first embodiment.

FIGS. 6BA, 6BB, and 6BC are views for explaining the method for manufacturing the SGT-including memory device according to the second embodiment.

FIGS. 6CA, 6CB, and 6CC are views for explaining the method for manufacturing the SGT-including memory device according to the second embodiment.

DETAILED DESCRIPTION OF THE PREFERRED EMBODIMENTS

A semiconductor element-including memory device (hereinafter, referred to as a dynamic flash memory) according to the present invention will now be described with reference to the drawings.

First Embodiment

The structure and operation mechanisms of a dynamic flash memory cell according to a first embodiment of the present invention will be described with reference to FIGS. 1 to 5JC. The structure of the dynamic flash memory cell will be described with reference to FIG. 1. A data erasing mechanism will be described with reference to FIGS. 2A, 2B, and 2C. A data writing mechanism will be described with reference to FIGS. 3A, 3B, and 3C. A data reading mechanism will be described with reference to FIGS. 4AA to 4AC and FIGS. 4BD to 4BG. A method for manufacturing a dynamic flash memory will be described with reference to FIGS. 5AA to 5JC.

Figure 1:
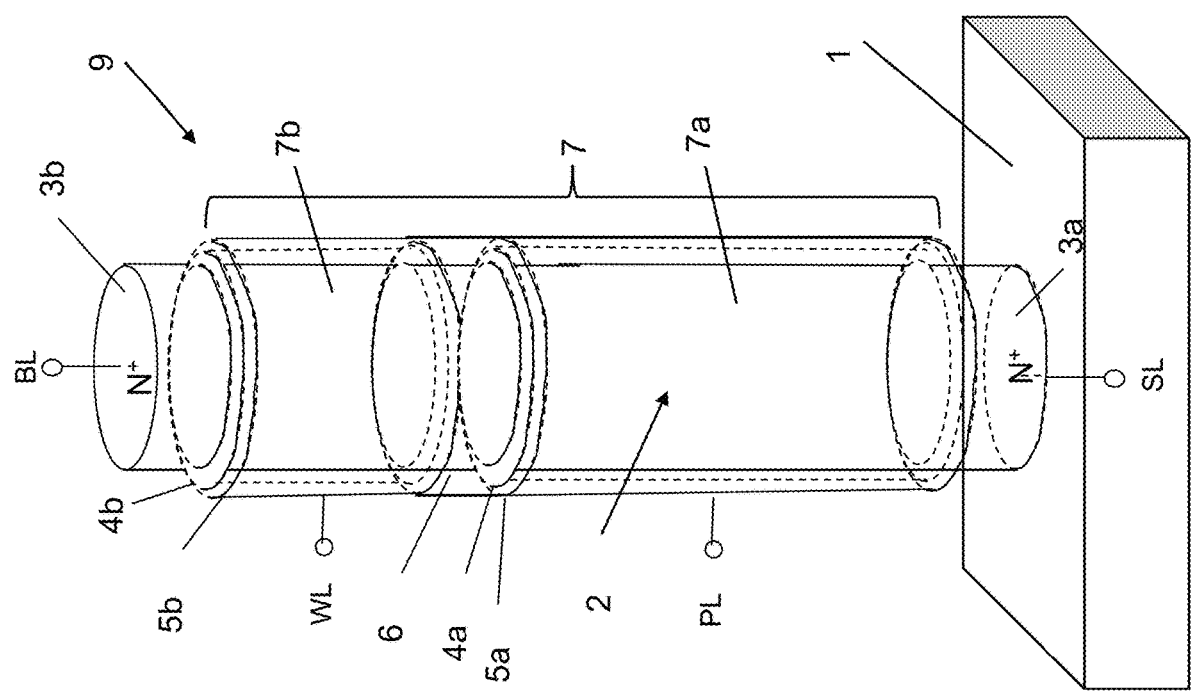
FIG. 1 is a structural view of an SGT-including memory device according to a first embodiment.

FIG. 1 illustrates the structure of a dynamic flash memory cell according to the first embodiment of the present invention. A Si pillar 2 of a P or i (intrinsic) conductivity type (hereinafter, a silicon semiconductor pillar is referred to as a "Si pillar") formed on a substrate 1 includes, in upper and lower portions thereof, N⁺ layers 3a and 3b one of which functions as a source and the other one of which functions as a drain (hereinafter, a semiconductor region containing a donor impurity at a high concentration is referred to as an "N⁺ layer"). A portion of the Si pillar 2 between the N⁺ layers 3a and 3b, which function as a source and a drain, functions as a channel region 7. A first gate insulating layer 4a and a second gate insulating layer 4b are formed so as to surround the channel region 7. The first gate insulating layer 4a and the second gate insulating layer 4b are respectively in contact with or close to the N⁺ layers 3a and 3b functioning as the source and the drain. A first gate conductor layer 5a and a second gate conductor layer 5b are formed so as to surround the first gate insulating layer 4a and the second gate insulating layer 4b, respectively. The first gate conductor layer 5a and the second gate conductor layer 5b are isolated from each other by an insulating layer 6. The channel region 7, which is a portion of the Si pillar 2 between the N⁺ layers 3a and 3b, is composed of a first channel Si layer 7a surrounded by the first gate insulating layer 4a and a second channel Si layer 7b surrounded by the second gate insulating layer 4b. Thus, the N⁺ layers 3a and 3b functioning as the source and the drain, the channel region 7, the first gate insulating layer 4a, the second gate insulating layer 4b, the first gate conductor layer 5a, and the second gate conductor layer 5b form a dynamic flash memory cell 9. The N⁺ layer 3a functioning as the source is connected to a source line SL, the N⁺ layer 3b functioning as the drain is connected to a bit line BL, the first gate conductor layer 5a is connected to a plate line PL, and the second gate conductor layer 5b is connected to a word line WL. The structure is preferably provided such that the gate capacitance of the first gate conductor layer 5a to which the plate line PL is connected is larger than the gate capacitance of the second gate conductor layer 5b to which the word line WL is connected.

In FIG. 1, the gate length of the first gate conductor layer 5a is made longer than the gate length of the second gate conductor layer 5b such that the gate capacitance of the first gate conductor layer 5a connected to the plate line PL is larger than the gate capacitance of the second gate conductor layer 5b to which the word line WL is connected. Alternatively, the thickness of the gate insulating film of the first gate insulating layer 4a may be made smaller than the thickness of the gate insulating film of the second gate insulating layer 4b by making the film thicknesses of the respective gate insulating layers different without making the gate length of the first gate conductor layer 5a longer than the gate length of the second gate conductor layer 5b. Alternatively, the dielectric constant of the gate insulating film of the first gate insulating layer 4a may be made higher than the dielectric constant of the gate insulating film of the second gate insulating layer 4b by making the dielectric constants of the materials of the respective gate insulating layers different. Alternatively, any of the lengths of the gate conductor layers 5a and 5b and the film thicknesses and the dielectric constants of the gate insulating layers 4a and 4b may be combined such that the gate capacitance of the first gate conductor layer 5a connected to the plate line PL is larger than the gate capacitance of the second gate conductor layer 5b to which the word line WL is connected.

Figure 2A:
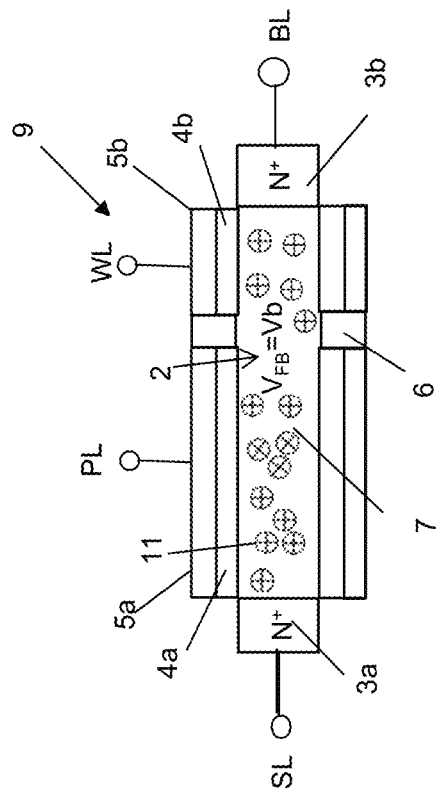
FIGS. 2A, 2B, and 2C are diagrams for explaining an erase operation mechanism of the SGT-including memory device according to the first embodiment.
Figure 2C:
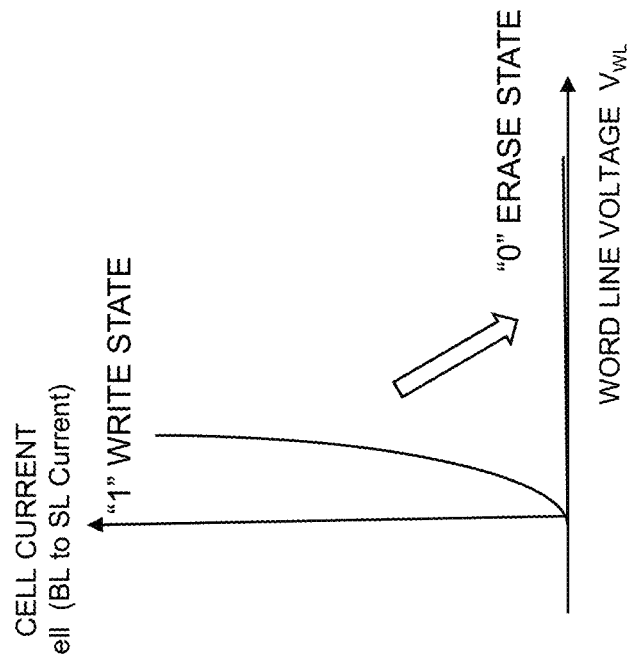
Figure 2B:
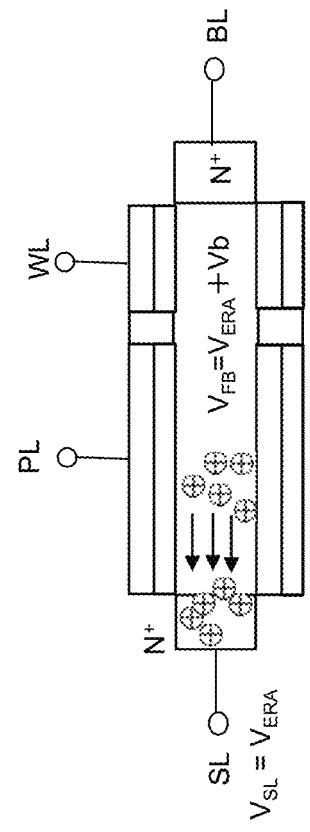

An erase operation mechanism will be described with reference to FIGS. 2A, 2B, and 2C. The channel region 7 between the N⁺ layers 3a and 3b is electrically isolated from the substrate and functions as a floating body. FIG. 2A illustrates a state in which a group of positive holes 11 generated by impact ionization in the previous cycle is accumulated in the channel region 7 before an erase operation. As illustrated in FIG. 2B, at the time of the erase operation, the voltage of the bit line BL is set to a negative voltage $V_{ERA}$. Here, $V_{ERA}$ is, for example, −3 V. As a result, regardless of the value of the initial potential of the channel region 7, the PN junction between the N⁺ layer 3a which functions as the source and to which the source line SL is connected and the channel region 7 is forward biased. As a result, the group of positive holes 11 generated by impact ionization in the previous cycle and accumulated in the channel region 7 is drawn into the N⁺ layer 3a functioning as a source portion, and the potential $V_{FB}$ of the channel region 7 becomes $V_{FB}=V_{ERA}+Vb$. Here, Vb represents the built-in voltage of the PN junction and is about 0.7 V. Thus, in the case of $V_{ERA}=-3$ V, the potential of the channel region 7 is −2.3 V. This value represents the state of the potential of the channel region 7 in an erase state. Accordingly, when the potential of the channel region 7 serving as the floating body becomes a negative voltage, the threshold voltage of the N-channel MOS transistor of a dynamic flash memory cell 9 increases due to a substrate bias effect. Accordingly, as illustrated in FIG. 2C, the threshold voltage of the second gate conductor layer 5b to which the word line WL is connected increases. This erase state of the channel region 7 corresponds to logical storage data "0". In data reading, the voltage applied to the first gate conductor layer 5a connected to the plate line PL is set to be higher than the threshold voltage at the time of logical storage data "1" and lower than the threshold voltage at the time of logical storage data "0" to thereby obtain the characteristic that a current does not flow even when the voltage of the word line WL is increased in logical storage data "0" reading, as illustrated in FIG. 2C. At the time of "1" writing, a gate-induced drain leakage (GIDL) current (refer to, for example, E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006) may be used to generate electron-positive hole pairs, and the inside of the floating body FB may be filled with the generated group of positive holes. Note that the above-described voltage conditions are examples for performing the erase operation, and other voltage conditions may be employed as long as the erase operation can be performed.

Figure 3A:
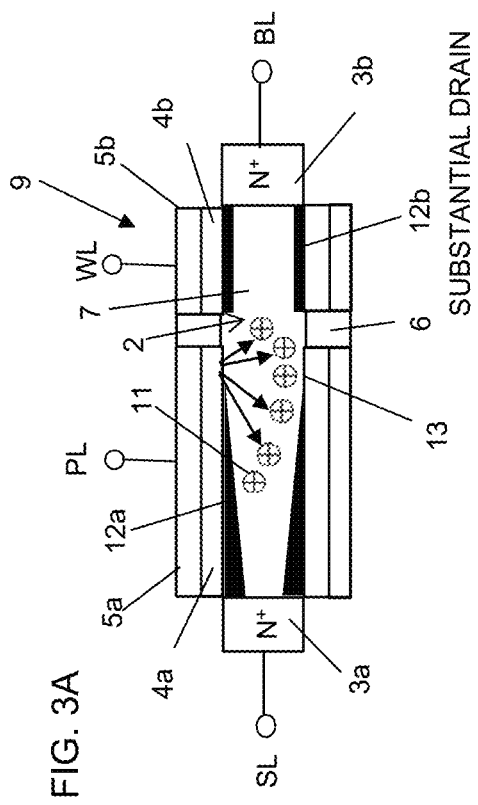
FIGS. 3A, 3B, and 3C are diagrams for explaining a write operation mechanism of the SGT-including memory device according to the first embodiment.
Figure 3B:
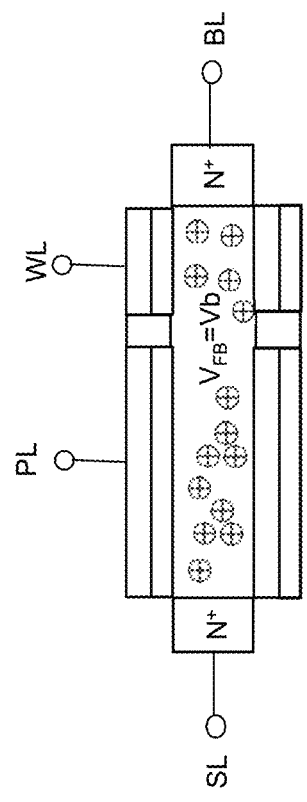
Figure 3C:
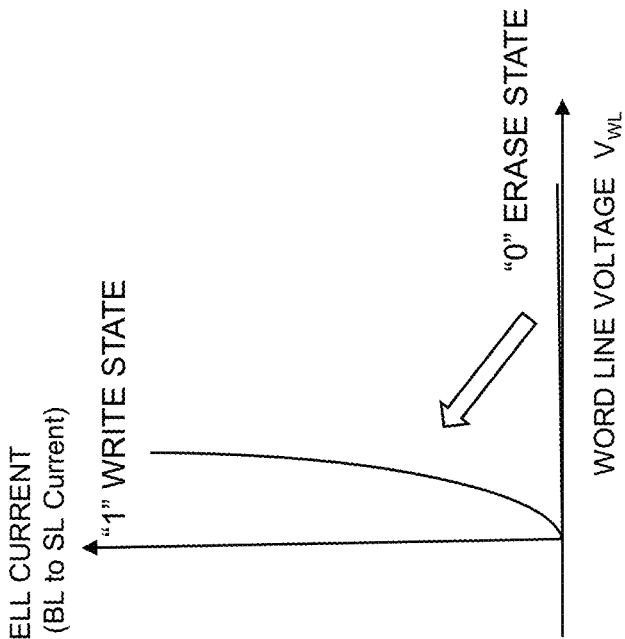

FIGS. 3A, 3B, and 3C illustrate a write operation of the dynamic flash memory cell according to the first embodiment of the present invention. As illustrated in FIG. 3A, for example, 0 V is input to the N⁺ layer 3a to which the source line SL is connected, for example, 3 V is input to the N⁺ layer 3b to which the bit line BL is connected, for example, 2 V is input to the first gate conductor layer 5a to which the plate line PL is connected, and, for example, 5 V is input to the second gate conductor layer 5b to which the word line WL is connected. As a result, as illustrated in FIG. 3A, an inversion layer 12a is formed on the inner periphery of the first gate conductor layer 5a to which the plate line PL is connected, and a first N-channel MOS transistor region including the first gate conductor layer 5a is operated in the saturation region. As a result, in the inversion layer 12a on the inner periphery of the first gate conductor layer 5a to which the plate line PL is connected, a pinch-off point 13 is present. On the other hand, a second N-channel MOS transistor region including the second gate conductor layer 5b to which the word line WL is connected is operated in the linear region. As a result, on the inner periphery of the second gate conductor layer 5b to which the word line WL is connected, no pinch-off point is present and an inversion layer 12b is formed on the entire surface. This inversion layer 12b that is formed over the entire surface directly under the second gate conductor layer 5b to which the word line WL is connected substantially functions as the drain of the second N-channel MOS transistor region including the second gate conductor layer 5b. As a result, the electric field becomes maximum in a boundary region of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a region on the source side when viewed from the second N-channel MOS transistor region including the second gate conductor layer 5b to which the word line WL is connected, and thus this phenomenon is referred to as a source-side impact ionization phenomenon. As a result of this source-side impact ionization phenomenon, electrons flow from the N⁺ layer 3a to which the source line SL is connected toward the N⁺ layer 3b to which the bit line BL is connected. The accelerated electrons collide with lattice Si atoms, and electron-positive hole pairs are generated by the kinetic energy. Although some of the generated electrons flow into the first gate conductor layer 5a and the second gate conductor layer 5b, most of the generated electrons flow into the N⁺ layer 3b to which the bit line BL is connected (not illustrated). Note that the above-described voltage conditions are examples for performing the write operation, and other voltage conditions may be employed as long as the write operation can be performed.

As illustrated in FIG. 3B, the generated group of positive holes 11 serves as majority carriers in the channel region 7 and charges the channel region 7 to a positive bias. Since 0 V is input to the N⁺ layer 3a to which the source line SL is connected, the channel region 7 is charged up to the built-in voltage Vb (about 0.7 V) of the PN junction between the N⁺ layer 3a to which the source line SL is connected and the channel region 7. When the channel region 7 is charged to a positive bias, the threshold voltages of the first N-channel MOS transistor region and the second N-channel MOS transistor region decrease due to a substrate bias effect. As a result, as illustrated in FIG. 3C, the threshold voltage of the second N-channel MOS transistor region of a second channel region 7b to which the word line WL is connected decreases. This write state of the channel region 7 is assigned to logical storage data "1".

At the time of the write operation, electron-positive hole pairs may be generated by an impact ionization phenomenon or a GIDL current in a second boundary region between a first impurity layer and a first channel semiconductor layer or in a third boundary region between a second impurity layer and a second channel semiconductor layer instead of the above-described boundary region of the channel region 7 between the first N-channel MOS transistor region including the first gate conductor layer 5a and the second N-channel MOS transistor region including the second gate conductor layer 5b, and the channel region 7 may be charged with the generated group of positive holes 11.

Figure 4A:
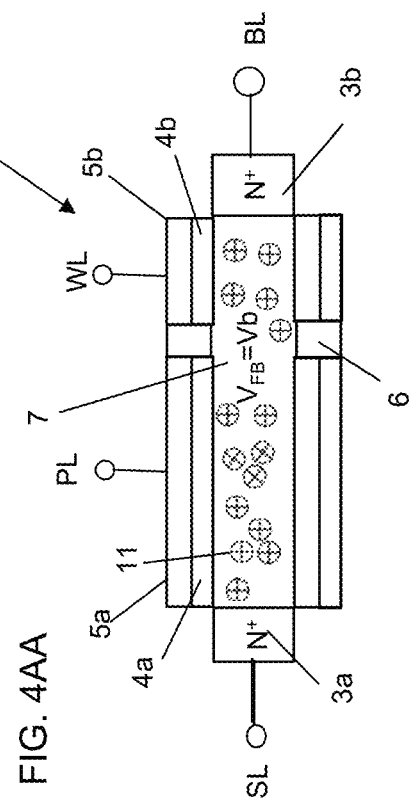
FIGS. 4AA, 4AB, and 4AC are diagrams for explaining a read operation mechanism of the SGT-including memory device according to the first embodiment.
Figure 4A:
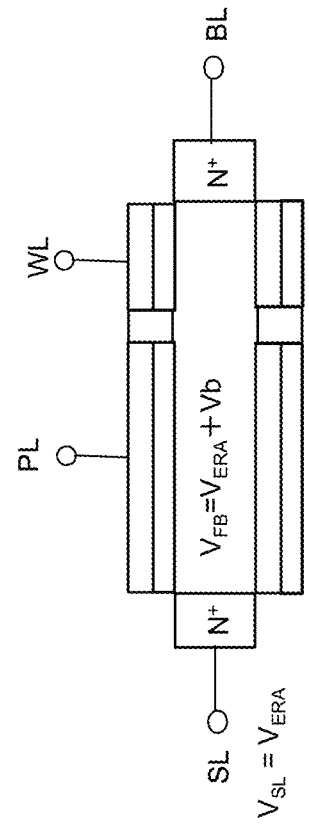
Figure 4A:
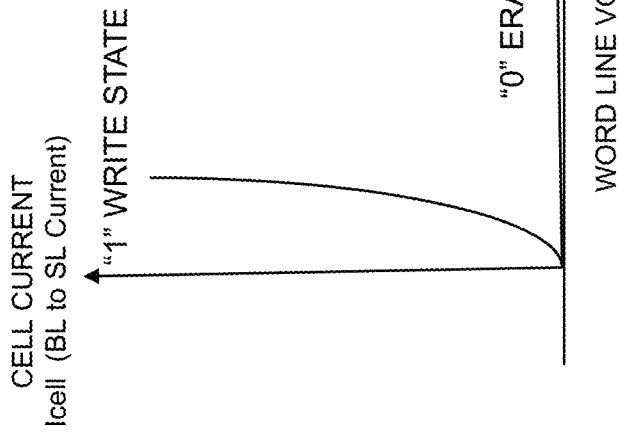
Figure 4B:
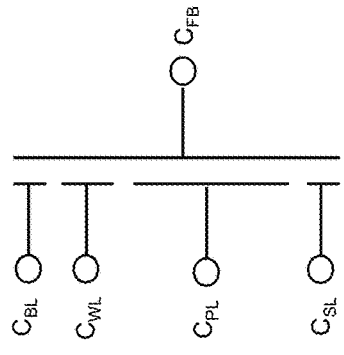
FIGS. 4BD, 4BE, 4BF, and 4BG are diagrams for explaining the read operation mechanism of the SGT-including memory device according to the first embodiment.
Figure 4B:
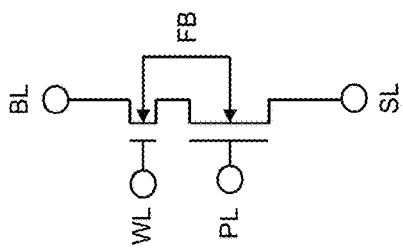
Figure 4B:
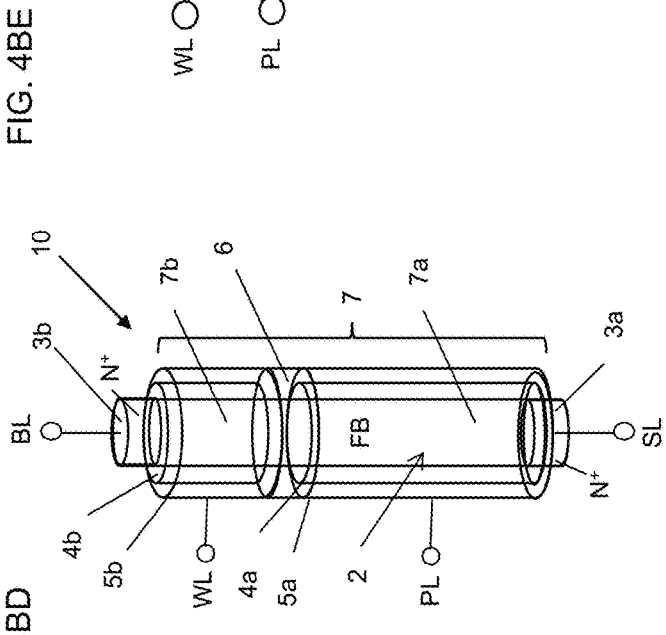
Figure 4B:
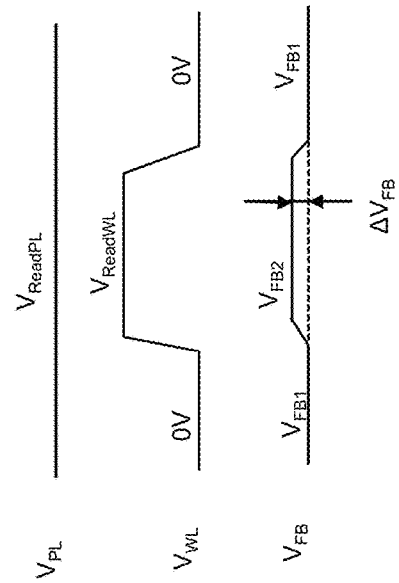

FIGS. 4AA to 4AC and FIGS. 4BD to 4BG are diagrams for explaining a read operation of the dynamic flash memory cell according to the first embodiment of the present invention. As illustrated in FIG. 4AA, when the channel region 7 is charged up to the built-in voltage Vb (about 0.7 V), the threshold voltage of the N-channel MOS transistor decreases due to a substrate bias effect. This state is assigned to logical storage data "1". As illustrated in FIG. 4AB, in the case where a memory block selected before writing is in an erase state "0" in advance, the floating voltage $V_{FB}$ of the channel region 7 is $V_{ERA}$+Vb. A write state "1" is stored at random by the write operation. As a result, logical storage data of logical "0" and logical "1" is created for the word line WL. As illustrated in FIG. 4AC, the level difference between the two threshold voltages for the word line WL is utilized to perform reading by a sense amplifier. In data reading, the voltage applied to the first gate conductor layer 5a connected to the plate line PL is set to be higher than the threshold voltage at the time of logical storage data "1" and lower than the threshold voltage at the time of logical storage data "0" to thereby obtain the characteristic that a current does not flow even when the voltage of the word line WL is increased in logical storage data "0" reading, as illustrated in FIG. 4AC.

FIG. 4BD is a structural view for explaining the magnitude relation between the gate capacitance of the first gate conductor layer 5a and the gate capacitance of the second gate conductor layer 5b at the time of the read operation of the dynamic flash memory cell according to the first embodiment of the present invention. It is desirable to design the gate capacitance of the second gate conductor layer 5b to which the word line WL is connected so as to be smaller than the gate capacitance of the first gate conductor layer 5a to which the plate line PL is connected. As illustrated in FIG. 4BD, the length, in the vertical direction, of the first gate conductor layer 5a to which the plate line PL is connected is made longer than the length, in the vertical direction, of the second gate conductor layer 5b to which the word line WL is connected so that the gate capacitance of the second gate conductor layer 5b to which the word line WL is connected is smaller than the gate capacitance of the first gate conductor layer 5a to which the plate line PL is connected. FIG. 4BE illustrates an equivalent circuit of one cell of the dynamic flash memory illustrated in FIG. 4BD. FIG. 4BF illustrates a coupling capacitance relationship of the dynamic flash memory. Here, $C_{WL}$ represents the capacitance of the second gate conductor layer 5b, $C_{PL}$ represents the capacitance of the first gate conductor layer 5a, $C_{BL}$ represents the capacitance of the PN junction between the N⁺ layer 3b that functions as the drain and a second channel region 7b, and $C_{SL}$ represents the capacitance of the PN junction between the N⁺ layer 3a that functions as the source and a first channel region 7a. As illustrated in FIG. 4BG, when the voltage applied to the word line WL changes, the operation affects the channel region 7 as noise. The potential change $\Delta V_{FB}$ in the channel region 7 at this time is expressed by $\Delta V_{FB} = C_{WL}/(C_{PL}+C_{WL}+C_{BL}+C_{SL}) \times V_{ReadWL}$. Here, $V_{ReadWL}$ represents a fluctuation potential of the word line WL at the time of reading. As is apparent from expression (1) in FIG. 4BG, when the contribution ratio of $C_{WL}$ is made small relative to the total capacitance $C_{PL}+C_{WL}+C_{BL}+C_{SL}$ of the channel region 7, $\Delta V_{FB}$ decreases. $C_{BL}+C_{SL}$ is the capacitance of the PN junctions. In order to increase this capacitance, for example, the diameter of the Si pillar 2 is increased. However, this is not desirable in view of the miniaturization of the memory cell. In contrast, when the length, in the vertical direction, of the first gate conductor layer 5a to which the plate line PL is connected is further made longer than the length, in the vertical direction, of the second gate conductor layer 5b to which the word line WL is connected, $\Delta V_{FB}$ can be further decreased without decreasing the degree of integration of the memory cell in plan view.

A method for manufacturing a dynamic flash memory of this embodiment will be described with reference to FIGS. 5AA to 5JC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 5A:
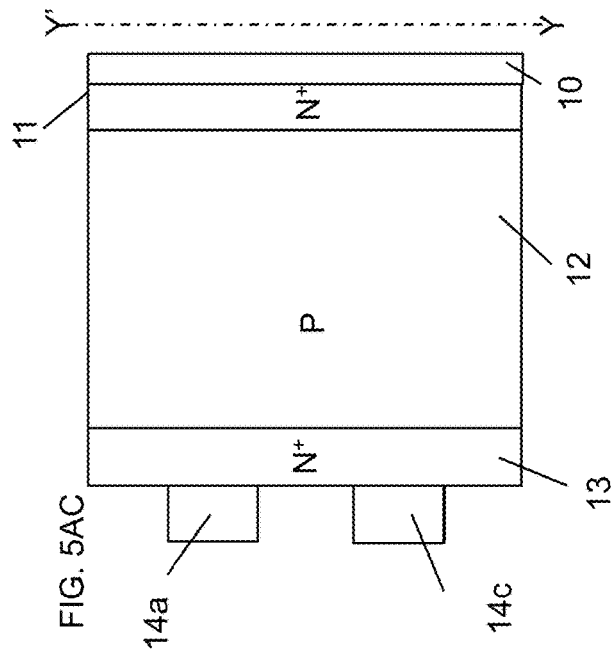
FIGS. 5AA, 5AB, and 5AC are views for explaining a method for manufacturing an SGT-including memory device according to the first embodiment.
Figure 5A:
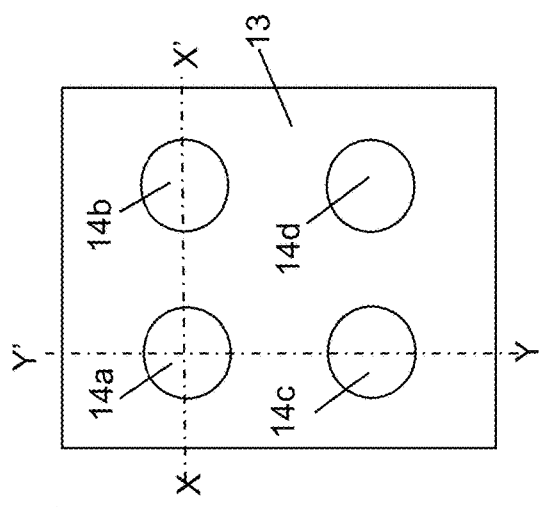
Figure 5A:
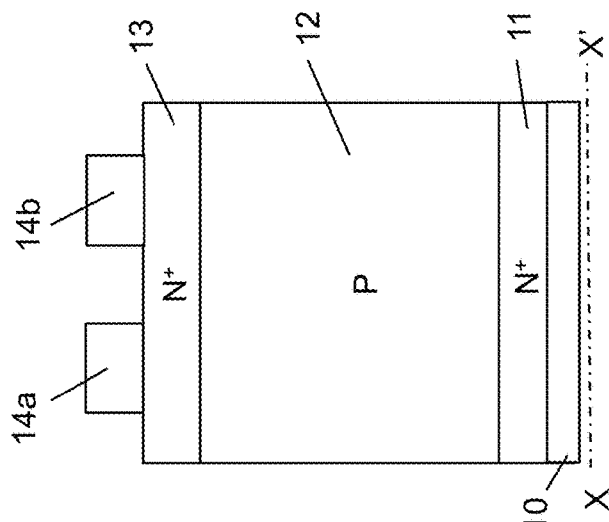

As illustrated in FIGS. 5AA to 5AC, on a substrate 10 (which is an example of "substrate" in the claims), an N⁺ layer 11 (which is an example of "first impurity region" in the claims), a P layer 12 made of Si, and an N⁺ layer 13 are formed in this order from the bottom. Subsequently, mask material layers 14a, 14b, 14c, and 14d (which are examples of "first mask material layer" in the claims) each having a circular shape in plan view are formed. The substrate 10 may be composed of silicon-on-insulator (SOI) or may be composed of Si or another semiconductor material formed of a single layer or a plurality of layers. A well layer formed of one or more N layers or one or more P layers may be used.

Figure 5B:
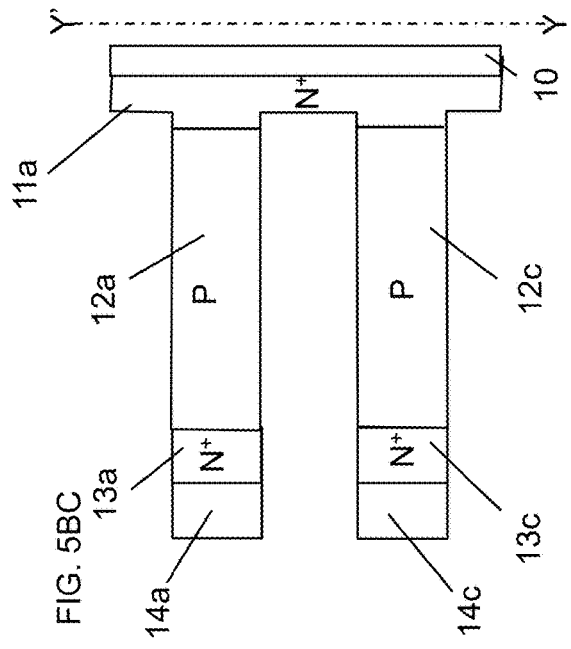
FIGS. 5BA, 5BB, and 5BC are views for explaining the method for manufacturing the SGT-including memory device according to the first embodiment.
Figure 5B:
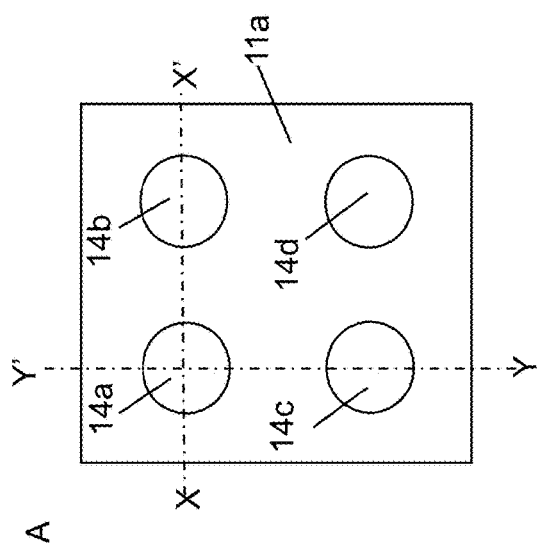
Figure 5B:
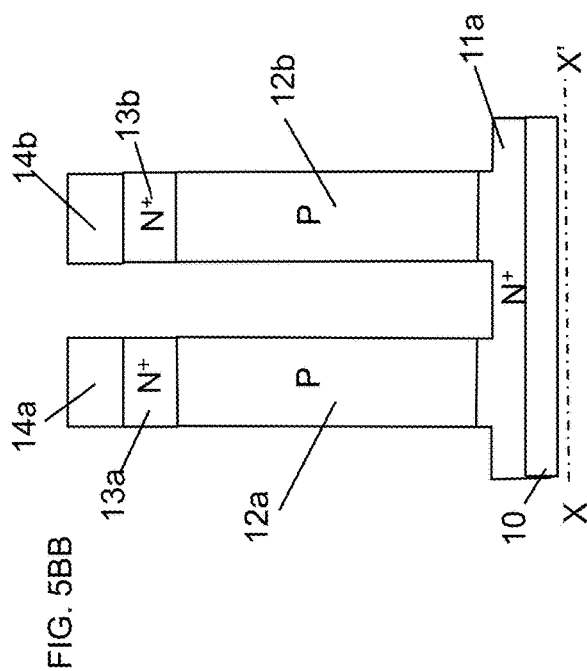

Next, as illustrated in FIGS. 5BA to 5BC, the N⁺ layer 13, the P layer 12, and an upper portion of the N⁺ layer 11 are etched using the mask material layers 14a to 14d as a mask to form, on an N⁺ layer 11a, a Si pillar 12a (which is an example of "first semiconductor pillar" in the claims), a Si pillar 12b (which is an example of "second semiconductor pillar" in the claims), a Si pillar 12c (which is an example of "third semiconductor pillar" in the claims), and a Si pillar 12d (not illustrated) (which is an example of "fourth semiconductor pillar" in the claims), and N⁺ layers 13a, 13b, 13c, and 13d (not illustrated) (each of which is an example of "second impurity region" in the claims). The Si pillars 12a and 12b are formed on a first line (which is an example of "first line" in the claims) passing through the center points thereof, and the Si pillars 12c and 12d are formed on a second line (which is an example of "second line" in the claims) passing through the center points thereof and parallel to the first line.

Figure 5C:
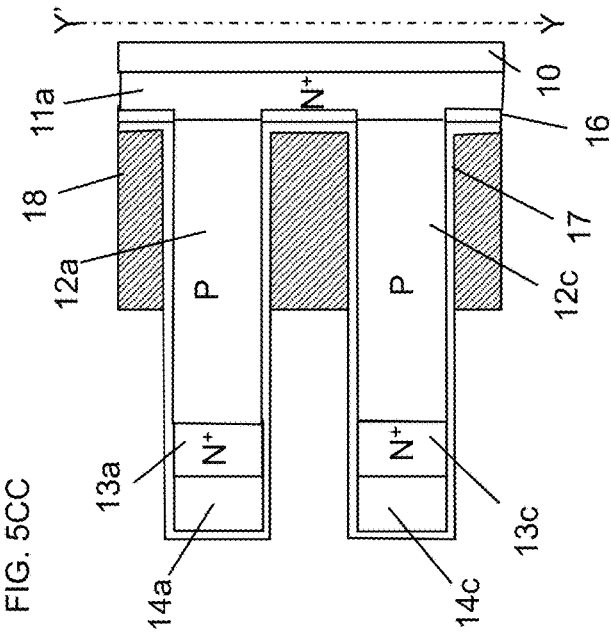
FIGS. 5CA, 5CB, and 5CC are views for explaining the method for manufacturing the SGT-including memory device according to the first embodiment.
Figure 5C:
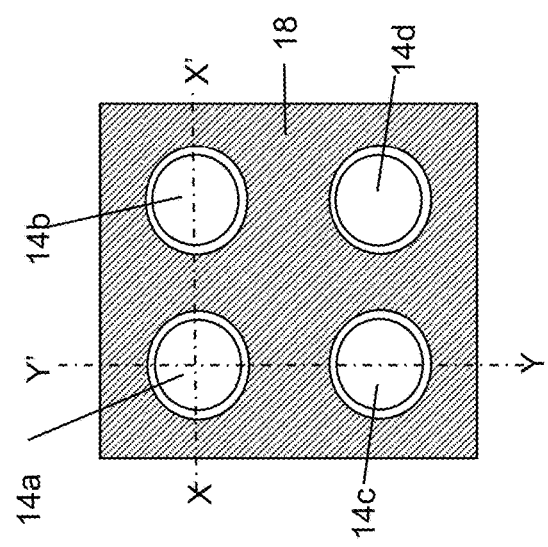
Figure 5C:
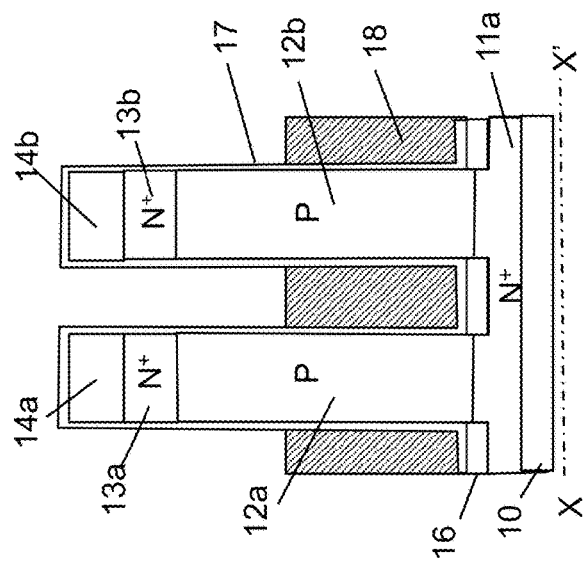

Next, as illustrated in FIGS. 5CA to 5CC, a gate insulating layer that is a HfO₂ layer 17 (which is an example of "first insulating layer" in the claims) is formed so as to cover the entire structure by, for example, atomic layer deposition (ALD). Subsequently, a TiN layer (not illustrated) that functions as a gate conductor layer is formed so as to cover the entire structure. Subsequently, polishing is performed by chemical mechanical polishing (CMP) such that the level of the upper surface corresponds to the upper surface of the mask material layers 14a to 14d. Subsequently, the TiN layer is etched by reactive ion etching (RIE) such that the level of the upper surface of the TiN layer in the vertical direction is located near the middle positions of the Si pillars 12a to 12d to form a TiN layer 18 (which is an example of "first gate conductor layer" in the claims). The HfO₂ layer 17 may be another insulating layer formed of a single layer or a plurality of layers as long as the insulating layer functions as the gate insulating layer. The TiN layer 18 used may be another conductor layer formed of a single layer or a plurality of layers as long as the conductor layer has a function of the gate conductor layer. It is desirable to etch the TiN layer such that the level of the upper surface of the TiN layer 18 in the vertical direction is located above the middle positions of the Si pillars 12a to 12d.

Figure 5D:
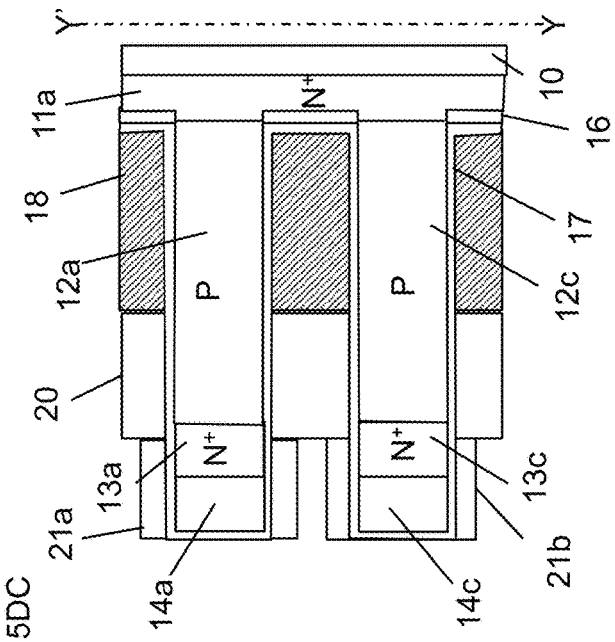
FIGS. 5DA, 5DB, and 5DC are views for explaining the method for manufacturing the SGT-including memory device according to the first embodiment.
Figure 5D:
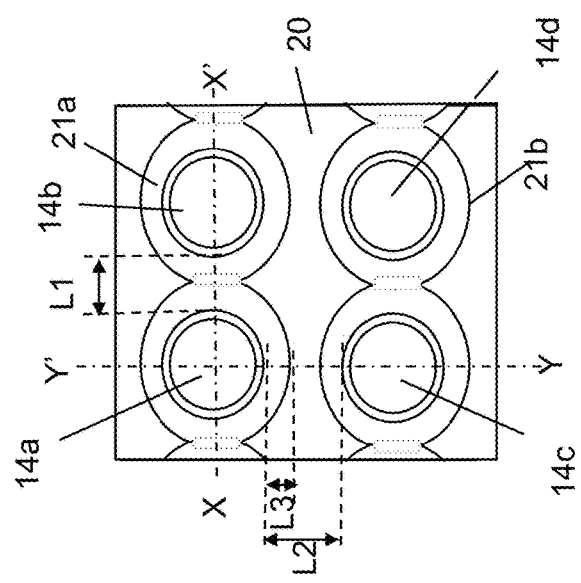
Figure 5D:
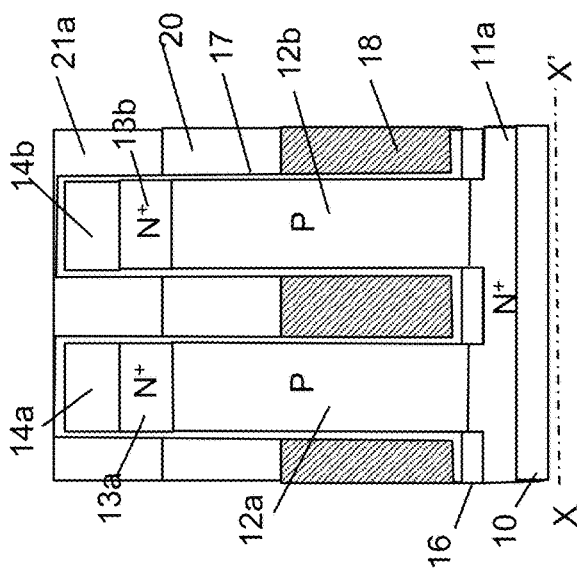

Next, as illustrated in FIGS. 5DA to 5DC, a SiO₂ layer 20 whose upper surface is located near the lower ends of the N⁺ layers 13a to 13d is formed. Subsequently, the entire structure is covered with a silicon nitride (SiN) layer (not illustrated). Subsequently, polishing is performed by CMP such that the level of the upper surface corresponds to the level of the upper surfaces of the mask material layers 14a to 14d. Subsequently, the SiN layer is etched by RIE to form, on side surfaces of the N⁺ layers 13a to 13d and side surfaces of the mask material layers 14a to 14d, a SiN layer 21a (which is an example of "second mask material layer" in the claims) and a SiN layer 21b (which is an example of "third mask material layer" in the claims) that extend between the Si pillars 12a and 12b and between the Si pillars 12c and 12d, respectively, and separated between the Si pillars 12a and 12c and between the Si pillars 12b and 12d. When the Si pillars 12a to 12d are arranged so as to be sufficiently apart from each other in the line X-X' direction and in the line Y-Y' direction in plan view, the SiN layers 21a and 21b are formed to surround the periphery of each of the Si pillars 12a to 12d with a substantially uniform width. The length of this uniform width is L3 (which is an example of "third length" in the claims) illustrated in FIG. 5DA. As illustrated in FIG. 5DA, when a length L1 (which is an example of "first length" in the claims) between points where the outer circumferential lines of the HfO₂ layers 17 surrounding the Si pillars 12a and 12b intersect line X-X' is made smaller than twice the width L3, the SiN layer 21a is formed so as to extend between the Si pillars 12a and 12b. Similarly, the SiN layer 21b is formed so as to extend between the Si pillars 12c and 12d. As illustrated in FIG. 5DA, when a length L2 (which is an example of "second length" in the claims) between points where the outer circumferential lines of the HfO₂ layers 17 surrounding the Si pillars 12a and 12c intersect line Y-Y' is made larger than twice the width L3, the SiN layers 21a and 21b are formed so as to be separated between the Si pillars 12a and 12c and between the Si pillars 12b and 12d.

Next, as illustrated in FIGS. 5EA to 5EC, the SiO₂ layer 20 and the TiN layer 18 are etched using the SiN layers 21a and 21b and the mask material layers 14a to 14d as a mask to form a SiO₂ layer 20a and a TiN layer 18a (which is an example of "first gate conductor layer" in the claims) surrounding the Si pillars 12a and 12b and a SiO₂ layer 20b and a TiN layer 18b (which is, together with the TiN layer 18a, an example of "first gate conductor layer" in the claims) surrounding the Si pillars 12c and 12d. Subsequently, the SiN layers 21a and 21b and the SiO₂ layers 20a and 20b are removed.

Next, as illustrated in FIGS. 5FA to 5FC, a SiO₂ layer 23 (which is an example of "second insulating layer" in the claims) is formed such that the level of the upper surface of the SiO₂ layer 23 is located on the upper surfaces of the TiN layers 18a and 18b.

Figure 5G:
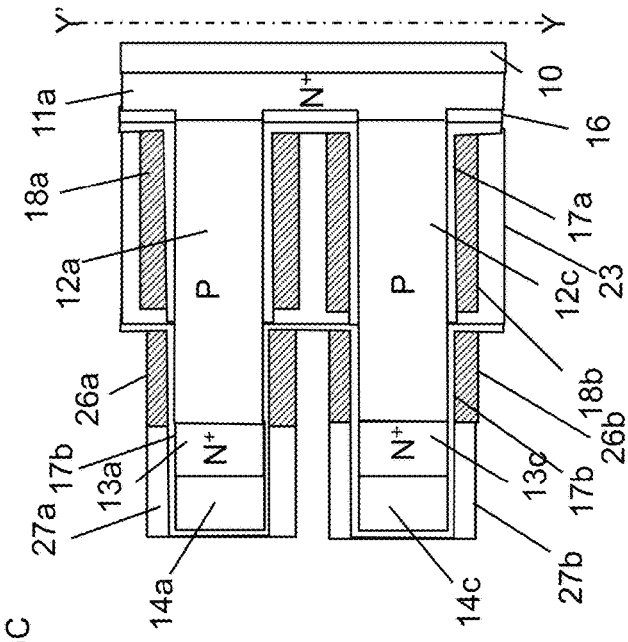
FIGS. 5GA, 5GB, and 5GC are views for explaining the method for manufacturing the SGT-including memory device according to the first embodiment.
Figure 5G:
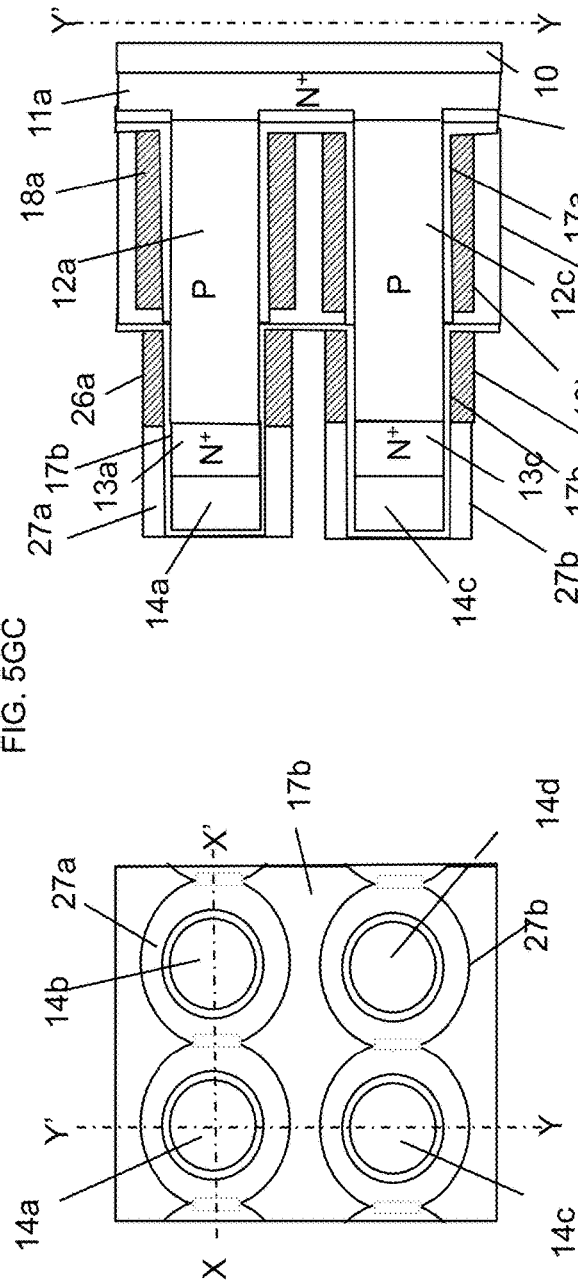
Figure 5G:
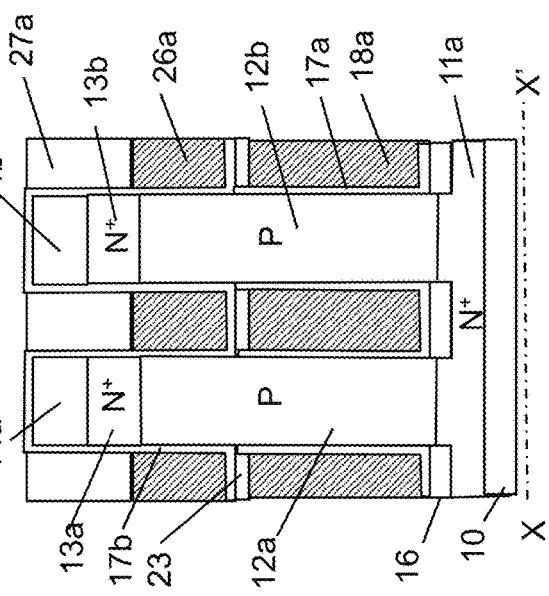

Next, as illustrated in FIGS. 5GA to 5GC, a portion of the HfO₂ layer 17 above the SiO₂ layer 23 is etched to form a HfO₂ layer 17a (which is an example of "first gate insulating layer" in the claims). Subsequently, a HfO₂ layer 17b (which is an example of "second gate insulating layer" in the claims) is formed on the entire structure. Subsequently, a TiN layer (not illustrated) is formed by chemical vapor deposition (CVD) so as to cover the entire structure. Subsequently, the TiN layer is etched by RIE such that the level of the upper surface of the TiN layer is located near the lower ends of the N⁺ layers 13a to 13d. Subsequently, a SiN layer 27a (which is an example of "fourth mask material layer" in the claims) that surrounds the side surfaces of the N⁺ layers 13a and 13b and the side surfaces of the mask material layers 14a and 14b and that extends continuously is formed by the same method as that used in the formation of the SiN layers 21a and 21b in FIGS. 5DA to 5DC. Similarly, a SiN layer 27b (which is an example of "fifth mask material layer" in the claims) that surrounds the side surfaces of the N⁺ layers 13c and 13d and the side surfaces of the mask material layers 14c and 14d and that extends continuously is formed. Subsequently, the TiN layer is etched using the SiN layers 27a and 27b as a mask to form a TiN layer 26a (which is an example of "third gate conductor layer" in the claims) and a TiN layer 26b (which is an example of "fourth gate conductor layer" in the claims).

Next, as illustrated in FIGS. 5HA to 5HD, a SiO₂ layer 29 including holes 31aa, 31ab, 31ac, 31ba, 31bb, 31bc, 31ca, 31cb, and 31cc (which are examples of "first holes" in the claims) is formed between the side surfaces and peripheries of the TiN layers 26a and 26b and the SiN layers 27a and 27b. FIG. 5HD is a cross-sectional view taken along line X1-X1' in FIG. 5HA (the same applies to FIGS. 5ID and 5IA). Note that the holes 31aa, 31ab, 31ac, 31ba, 31bb, 31bc, 31ca, 31cb, and 31cc are formed such that the level of the upper ends of the holes is lower than the level of the upper ends of the TiN layers 26a and 26b indicated by the dotted line in FIG. 5HD.

Next, as illustrated in FIGS. 5IA to 5ID, the mask material layers 14a, 14b, 14c, and 14d are etched to form contact holes 30a, 30b, 30c, and 30d, respectively.

Next, as illustrated in FIGS. 5JA to 5JC, a bit line BL1 conductor layer 32a (which is an example of "first wiring conductor layer" in the claims) connected to the N⁺ layers 13a and 13c through the contact holes 30a and 30c and a bit line BL2 conductor layer 32b (which is an example of "second wiring conductor layer" in the claims) connected to the N⁺ layers 13b and 13d through the contact holes 30b and 30d are formed. Subsequently, a SiO₂ layer 33 including holes 34a, 34b, and 34c (which are examples of "second holes" in the claims) is formed between the bit line BL1 conductor layer 32a and the bit line BL2 conductor layer 32b. As a result, a dynamic flash memory is formed on the substrate 10. The TiN layers 26a and 26b function as word line conductor layers WL1 and WL2, respectively, the TiN layers 18a and 18b function as plate line conductor layers PL1 and PL2, respectively, and the N⁺ layer 11a functions as a source line conductor layer SL.

In FIG. 1, it is desirable that the length, in the vertical direction, of the first gate conductor layer 5a to which the plate line PL is connected be further made longer than the length, in the vertical direction, of the second gate conductor layer 5b to which the word line WL is connected to satisfy $C_{PL}>C_{WF}$. However, a coupling ratio in capacitive coupling ($C_{WL}(C_{PL}+C_{WL}+C_{BL}+C_{SL})$) of the word line WL to the channel region 7 is decreased only by adding the plate line PL. As a result, the potential change $\Delta V_{FB}$ in the channel region 7 of the floating body decreases.

In FIG. 1, the first gate conductor layer 5a is connected to the plate line PL, and the second gate conductor layer 5b is connected to the word line WL. Alternatively, the second gate conductor layer 5b may be connected to the plate line PL, and the first gate conductor layer 5a may be connected to the word line WL.

A description has been made of an example of the voltages applied to the source line SL, the plate line PL, the word line WL, and the bit line BL in the erase operation in FIGS. 2A, 2B, and 2C, the write operation in FIGS. 3A, 3B, and 3C, and the read operation in FIGS. 4AA to 4BG. The voltages applied to the source line SL, the plate line PL, the word line WL, and the bit line BL may be changed as long as the basic operations of easing, writing, and reading can be performed. In FIG. 1, in the vertical direction, the potential distribution of the first channel region 7a and the second channel region 7b is continuously formed in a portion of the channel region 7 surrounded by the insulating layer 6. Thus, the first channel region 7a and the second channel region 7b of the channel region 7 are connected together in the vertical direction in a region surrounded by the insulating layer 6.

The N⁺ layer 11a in FIGS. 5JA to 5JC is formed before the step of forming the Si pillars 12a to 12d as illustrated in FIGS. 5AA to 5AC. In contrast, the N⁺ layer 11a may be formed in a step, for example, after the formation of the Si pillars 12a to 12d. Similarly, the N⁺ layers 13a to 13d in FIGS. 5JA to 5JC are formed using the N⁺ layer 13 that is formed before the step of forming the Si pillars 12a to 12d. In contrast, the N⁺ layers 13a to 13d may be formed in a step, for example, after the formation of the TiN layers 26a and 26b.

In FIGS. 5FA to 5FC and FIGS. 5GA to 5GC, insulation between the TiN layers 18a and 18b and the TiN layers 26a and 26b is achieved by the SiO₂ layer 23. Alternatively, for example, a low-resistance doped poly-Si may be used instead of the TiN layers 18a and 18b, and the above insulation may be achieved by a SiO₂ layer formed by oxidizing the surface of the doped poly-Si. Alternatively, instead of the doped poly-Si, a conductor material layer whose surface can be oxidized may be used. Alternatively, in FIGS. 5FA to 5FC, after the gate conductor layers (which correspond to the TiN layers 18a and 18b) are formed, the upper surfaces and the side surfaces of the gate conductor layers may be oxidized.

In this embodiment, the Si pillars 12a to 12d are arranged in a square lattice in plan view. Alternatively, the Si pillars 12a to 12d may be arranged in a diagonal lattice in plan view. In the diagonal lattice arrangement, Si pillars (not illustrated) connected to the Si pillars 12a and 12b are arranged in a staggered manner in the direction of line X-X'. Similarly, Si pillars (not illustrated) connected to the Si pillars 12c and 12d are arranged in a staggered manner in the direction of line X-X'. In this case, the relation of L1, L2, and L3 in FIGS. 5DA to 5DC is also maintained in the staggered arrangement. The same applies to other embodiments according to the present invention.

In FIGS. 5IA to 5ID, the holes 31aa, 31ab, 31ac, 31ba, 31bb, 31bc, 31ca, 31cb, and 31cc are formed so as to be isolated from each other. In contrast, the distance between the Si pillars 12a and 12c and the distance between the Si pillars 12b and 12d are increased, and the holes 31aa, 31ab, are 31ac may be continuously formed, the holes 31ba, 31bb, and 31bc may be continuously formed, and the holes 31ca, 31cb, and 31cc may be continuously formed.

As illustrated in FIGS. 5GA to 5GC, insulation between the TiN layer 18a and the TiN layer 26a is achieved by the SiO₂ layer 23 that covers the top of the TiN layer 18a, and the HfO₂ layer 17b serving as the gate insulating layer. In contrast, the insulation between the TiN layer 18a and the TiN layer 26a may be achieved by forming the HfO₂ layer 17b alone.

In the manufacturing method described in FIGS. 5EA to 5EC, the TiN layers 18a and 18b are formed using, as an etching mask, the SiN layers 21a and 21b formed by self-alignment. In contrast, the SiN layers 21a and 21b may be formed by photolithography and RIE instead of self-alignment. In this case, there are no limitations such as the distances between the Si pillars 12a to 12d. Similarly, the TiN layers 26a and 26b can be formed without using the self-alignment method described in FIGS. 5GA to 5GC.

This embodiment provides the following features:

Feature 1

In the dynamic flash memory cell of this embodiment, the $N^+$ layers $3a$ and $3b$ that function as the source and the drain, the channel region 7, the first gate insulating layer $4a$, the second gate insulating layer $4b$, the first gate conductor layer $5a$, and the second gate conductor layer $5b$ are formed in a pillar form as a whole. The $N^+$ layer $3a$ that functions as the source is connected to the source line SL, the $N^+$ layer $3b$ that functions as the drain is connected to the bit line BL, one of the first gate conductor layer $5a$ and the second gate conductor layer $5b$ is connected to the word line WL, and the other is connected to the plate line PL. In the dynamic flash memory cell, the first gate conductor layer and the second gate conductor layer are stacked in the vertical direction. Accordingly, even when the dynamic flash memory cell has a structure in which the gate capacitance of the first gate conductor layer $5a$ or second gate conductor layer $5b$ to which the plate line PL is connected is made larger than the gate capacitance of the gate conductor layer connected to the word line WL, the memory cell area does not increase in plan view. This enables the realization of a higher performance and a higher degree of integration of the dynamic flash memory cell.

Feature 2

In view of the roles of the first gate conductor layer $5a$ to which the plate line PL is connected in the dynamic flash memory cell according to the present invention illustrated in FIG. 1, the following five features (1) to (5) are provided.

(1) When the dynamic flash memory cell performs a write operation or a read operation, the voltage of the word line WL fluctuates. At this time, the plate line PL assumes the role of decreasing the capacitive coupling ratio between the word line WL and the channel region 7. As a result, the effect of a change in the voltage of the channel region 7 when the voltage of the word line WL fluctuates can be significantly suppressed. Thus, the difference between the threshold voltages of the SGT transistor for the word line WL that indicates logical "0" and logical "1" can be increased. This leads to an increase in the operation margin of the dynamic flash memory cell. Furthermore, in data reading, the voltage applied to the first gate conductor layer $5a$ connected to the plate line PL is set to be higher than the threshold voltage at the time of logical storage data "1" and lower than the threshold voltage at the time of logical storage data "0" to thereby obtain the characteristic that a current does not flow even when the voltage of the word line WL is increased in logical storage data "0" reading. This leads to a further increase in the operation margin of the dynamic flash memory cell.

(2) When the dynamic flash memory cell performs an erase operation, a write operation, or a read operation, both the first gate conductor layer $5a$ to which the plate line PL is connected and the second gate conductor layer $5b$ to which the word line WL is connected function as the gates of the SGT transistor. When a current flows from the bit line BL to the source line SL, a short channel effect of the SGT transistor can be suppressed. Thus, a short channel effect is suppressed by the first gate conductor layer $5a$ to which the plate line PL is connected. As a result, the data retention characteristics are improved.

(3) When a write operation of the dynamic flash memory cell is started, a group of positive holes is gradually accumulated in the channel region 7, and the threshold voltage of the first MOS transistor having the plate line PL and the threshold voltage of the second MOS transistor having the word line WL decrease. At this time, the threshold voltage of the first MOS transistor having the plate line PL decreases to promote an impact ionization phenomenon at the time of the write operation. As a result, the plate line PL provides positive feedback at the time of writing to achieve a higher-speed write operation.

(4) In the dynamic flash memory cell in which "1" is written, the threshold voltage of the first MOS transistor having the plate line PL decreases. As a result, each time a positive bias is applied to the plate line PL, an inversion layer is formed on the inner periphery of the first gate conductor layer $5a$ connected to the plate line PL. As a result, a layer of electrons accumulated in the inversion layer formed on the inner periphery of the first gate conductor layer $5a$ connected to the plate line PL functions as a conductor radio-wave shielding layer. Accordingly, the dynamic flash memory cell in which "1" is written is shielded from disturbance noise from the surroundings thereof.

(5) At the time of a write operation of the dynamic flash memory cell, photons are generated by an impact ionization phenomenon. The generated photons are repeatedly reflected at the first gate conductor layer $5a$ and the second gate conductor layer $5b$ and move in the vertical direction of the Si pillar 2. At this time, the plate line PL has a light-blocking effect for the photons such that the photons generated at the time of writing do not corrupt data in memory cells adjacent in the horizontal direction.

Feature 3

As illustrated in FIGS. 5DA to 5DC and FIGS. 5EA to 5EC, by making the length L1 between points where the outer circumferential lines of the $HfO_2$ layers 17 surrounding the Si pillars $12a$ and $12b$ intersect line X-X' smaller than twice the width L3 of the SiN layers $21a$ and $21b$ on line Y-Y', and making the length L2 between points where the outer circumferential lines of the $HfO_2$ layers 17 surrounding the Si pillars $12a$ and $12c$ intersect line Y-Y' larger than twice the width L3, the SiN layer $21a$ can be formed so as to extend between the Si pillars $12a$ and $12b$ and separated between the Si pillars $12b$ and $12d$. Similarly, the SiN layer $21b$ can be formed so as to extend between the Si pillars $12c$ and $12d$ and separated between the Si pillars $12a$ and $12c$. The SiN layers $21a$ and $21b$ are formed by self-alignment with respect to the Si pillars $12a$ to $12d$. Accordingly, the TiN layer $18a$ and $18b$ which serve as plate lines PL and which are gate conductor layers, the TiN layer $18a$ and $18b$ being respectively formed using the SiN layers $21a$ and $21b$ as an etching mask, are formed by self-alignment with respect to the Si pillars $12a$ to $12d$. Since the TiN layers $18a$ and $18b$ are formed by this self-alignment, a higher degree of integration of the dynamic flash memory can be achieved. In addition, since the TiN layers $18a$ and $18b$ are formed without using a mask pattern in a lithography process, the cost of the mask used can be reduced.

Feature 4

As illustrated in FIGS. 5GA to 5GC, the TiN layer $26a$ which serves as a word line WL and which is a gate conductor layer is formed so as to be separated from the TiN layer $26b$ and to extend between the Si pillars $12a$ and $12b$ by self-alignment with respect to the Si pillars $12a$ and $12b$. Similarly, the TiN layer $26b$ is formed so as to be separated from the TiN layer $26a$ and to extend between the Si pillars $12c$ and $12d$ by self-alignment with respect to the Si pillars $12c$ and $12d$. This enables a higher degree of integration of the dynamic flash memory. In addition, since the TiN layers $26a$ and $26b$ are formed without using a mask pattern in a lithography process as in the formation of the TiN layers $18a$ and $18b$, the cost of the mask used can be reduced. Furthermore, the TiN layers 26a and 26b which serve as word lines WL and are gate conductor layers are formed so as to overlap the TiN layers 18a and 18b which serve as plate lines PL and are gate conductor layers in plan view. This enables a higher degree of integration of the dynamic flash memory.

Second Embodiment

A method for manufacturing a dynamic flash memory according to a second embodiment will be described with reference to FIGS. 6AA to 6CC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

The steps illustrated in FIGS. 5AA to 5AC to FIGS. 5CA to 5CC are performed. Subsequently, as illustrated in FIGS. 6AA to 6AC, a portion of the HfO$_2$ layer 17 above the upper surface of the TiN layer 18 in the vertical direction is removed to form a HfO$_2$ layer 17a. Subsequently, a HfO$_2$ layer 33 is formed over the entire structure. Subsequently, the entire structure is covered with a TiN layer (not illustrated). Subsequently, polishing is performed by CMP such that the level of the upper surface correspond to the upper surfaces of the mask material layers 14a to 14d. Subsequently, etching is performed by RIE such that the level of the upper surface is located near the lower ends of the N$^+$ layers 13a to 13d to form a TiN layer 34.

Next, as illustrated in FIGS. 6BA to 5BC, the entire structure is covered with a silicon nitride (SiN) layer (not illustrated). Subsequently, polishing is performed by CMP such that the level of the upper surface is located at the level of the upper surfaces of the mask material layers 14a to 14d. Subsequently, the SiN layer is etched by RIE to form, on side surfaces of the N$^+$ layers 13a to 13d and side surfaces of the mask material layers 14a to 14d, SiN layers 36a and 36b that are connected between the Si pillars 12a and 12b and between the Si pillars 12c and 12d, respectively, and separated between the Si pillars 12a and 12c and between the Si pillars 12b and 12d.

Next, as illustrated in FIGS. 6CA to 6CC, the TiN layer 34, the HfO$_2$ layer 33, and the TiN layer 18 are etched using the SiN layers 36a and 36b and the mask material layers 14a to 14d as a mask to form TiN layers 18c, 18d, 34a, and 34b and HfO$_2$ layers 33a and 33b. Subsequently, the same steps as those described in FIGS. 5HA to 5HD and FIGS. 5IA to 5ID are performed. As a result, a dynamic flash memory is formed on the substrate 10 as in the first embodiment.

Note that after the formation of the TiN layers 18c, 18d, 34a, and 34b and the HfO$_2$ layers 33a and 33b, an insulating layer having holes can be formed between the TiN layers 18c and 34a and the TiN layers 18d and 34b. As a result, the coupling capacitance between the plate lines and the coupling capacitance between the word lines can be reduced.

Figure 6A:
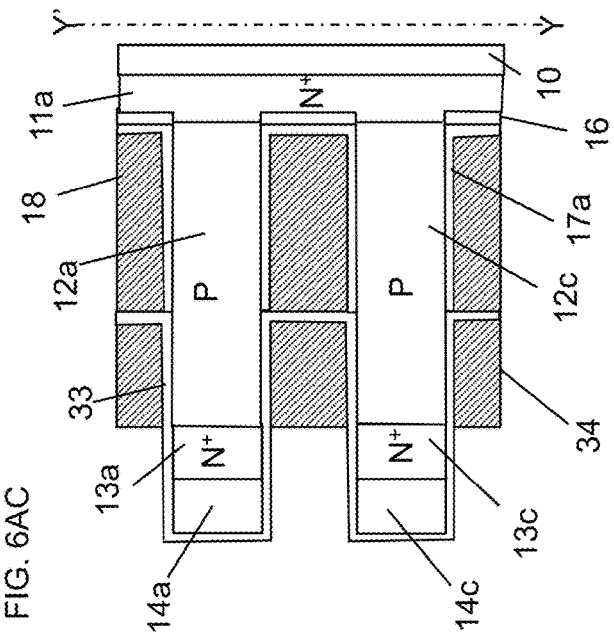
FIGS. 6AA, 6AB, and 6AC are views for explaining a method for manufacturing an SGT-including memory device according to a second embodiment.
Figure 6A:
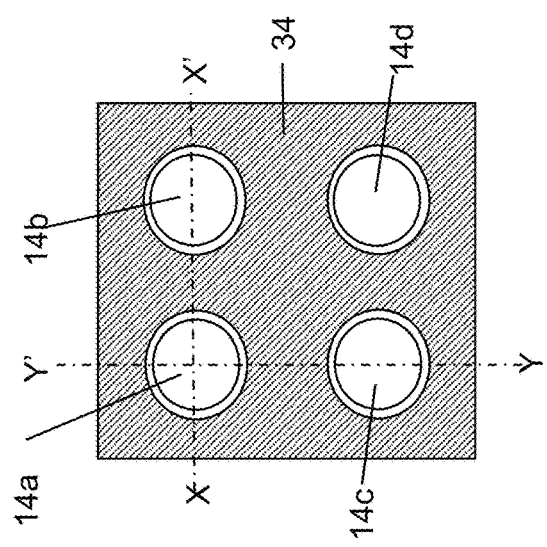
Figure 6A:
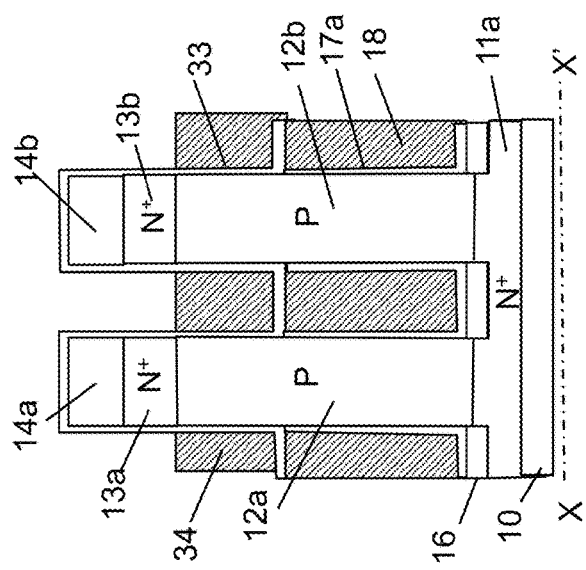
Figure 7B:
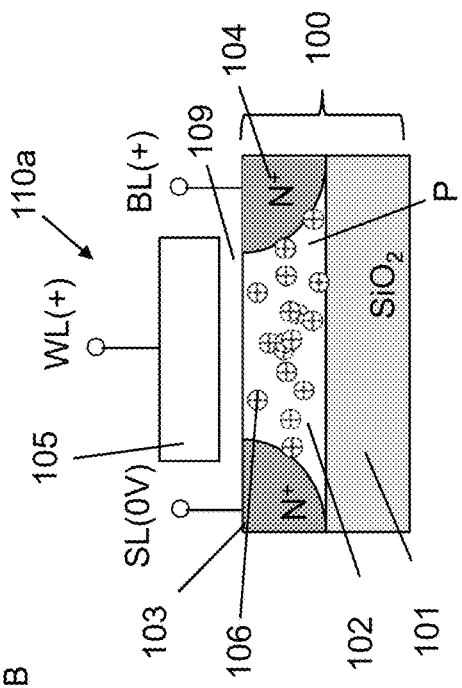
FIGS. 7A, 7B, 7C, and 7D are diagrams illustrating a write operation of a DRAM memory cell including no capacitor in the related art.
Figure 7A:
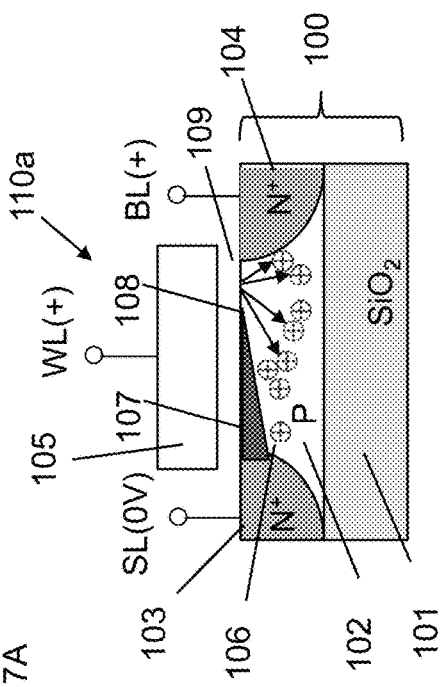
Figure 7D:
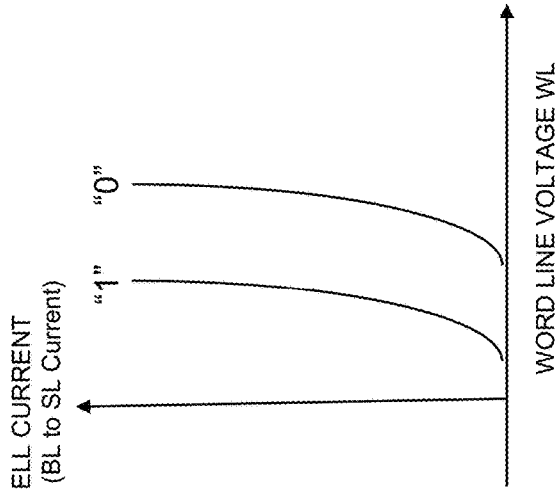
Figure 7C:
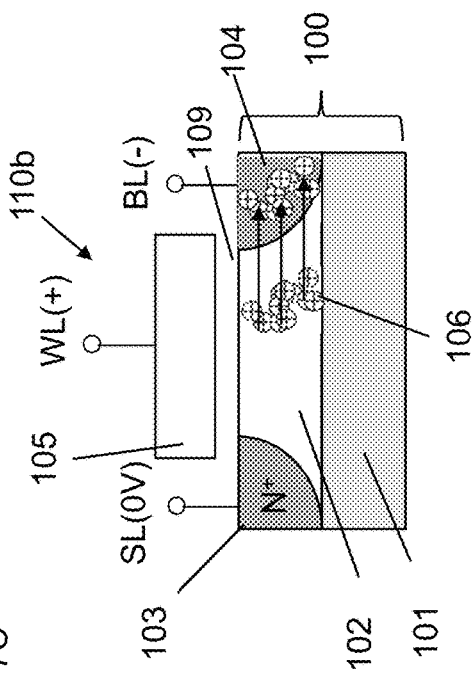
Figure 8A:
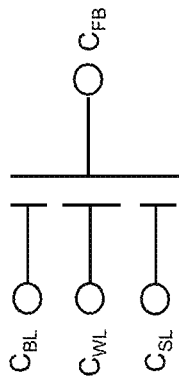
FIGS. 8A and 8B are diagrams for explaining a problem in the operation of the DRAM memory cell including no capacitor in the related art.
Figure 8B:
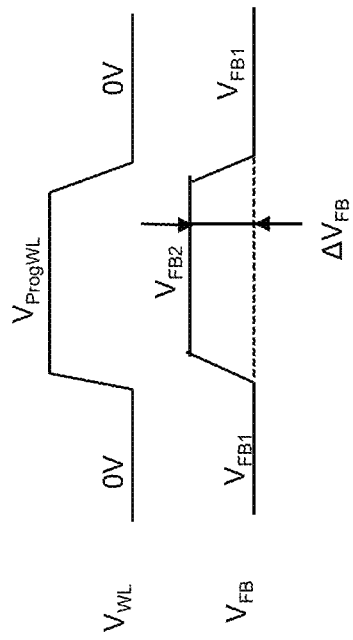
Figure 9C:
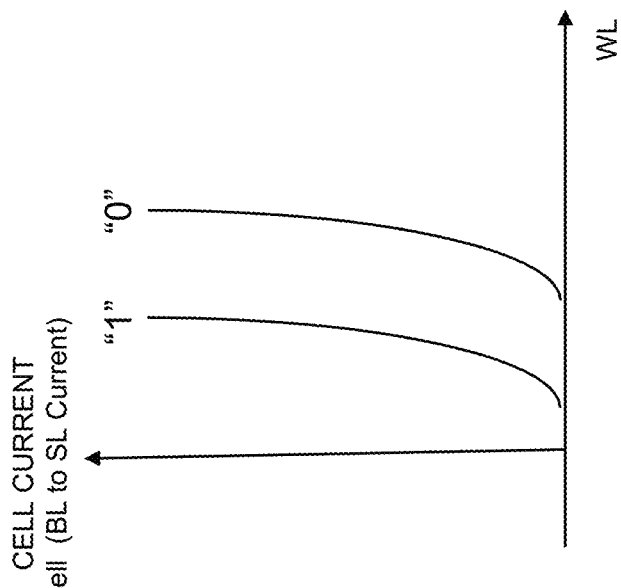
FIGS. 9A, 9B, and 9C are diagrams illustrating a read operation of the DRAM memory cell including no capacitor in the related art.
Figure 9A:
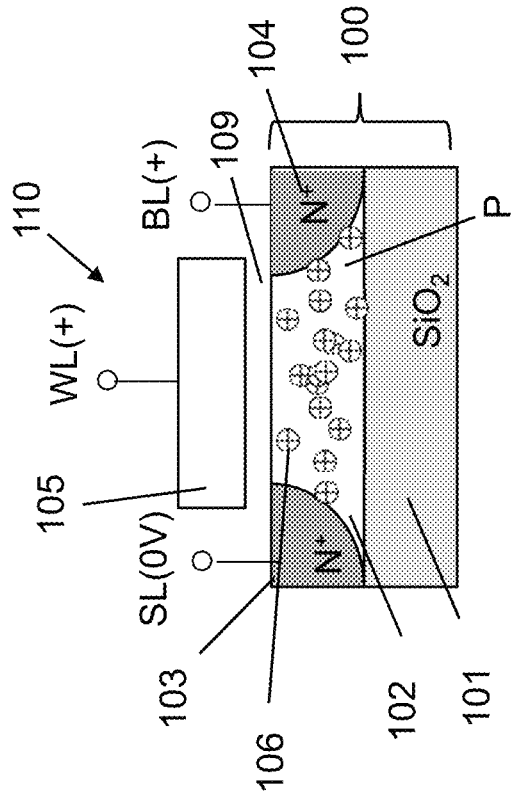
Figure 9B:
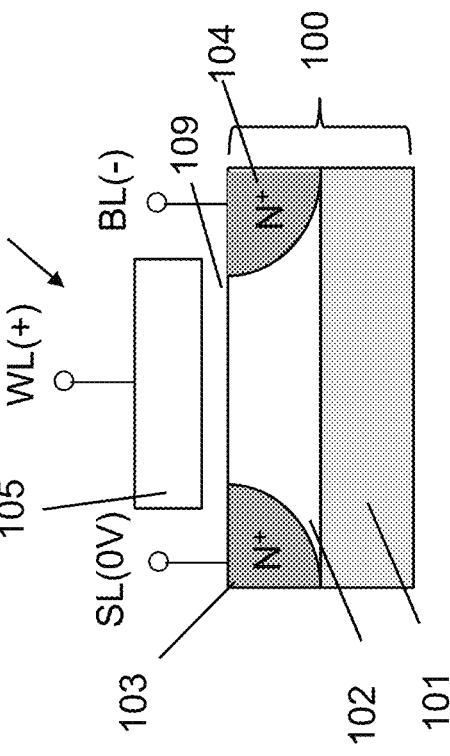

In FIGS. 6AA to 6AC, a low-resistance doped poly-Si may be used instead of the TiN layer 18, a surface of the doped poly-Si may be oxidized to form a SiO$_2$ layer, and the HfO$_2$ layer 33 may then be formed. Alternatively, instead of the doped poly-Si, a conductor material layer whose surface can be oxidized may be used.

This embodiment provides the following features. In the method for manufacturing a dynamic flash memory illustrated in FIGS. 5AA to 5JC, the TiN layers 18a and 18b which are gate conductor layers of the plate lines PL and the TiN layers 26a and 26b which are gate conductor layers of the word lines WL are separately formed. In contrast, in this embodiment, the TiN layer 34, the HfO$_2$ layer 33, and the TiN layer 18 are etched at one time using the SiN layers 36a and 36b and the mask material layers 14a to 14d as a mask to form the TiN layers 18c and 18d that serve as the plate lines PL and the gate conductor layers and the TiN layers 34a and 34b that serve as the word lines WL and the gate conductor layers, as illustrated in FIGS. 6CA to 6CC. This makes it easy to manufacture the dynamic flash memory.

OTHER EMBODIMENTS

In the present invention, Si pillars 2 and 12a to 12d are formed. Alternatively, semiconductor pillars made of a semiconductor material other than Si may be formed. The same applies to other embodiments according to the present invention.

The N$^+$ layers 3a, 3b, 11, and 13 in the first embodiment may each be a Si layer or another semiconductor material layer containing a donor impurity. The N$^+$ layers 3a, 3b, 11, and 13 may be formed of different semiconductor material layers. The N$^+$ layers may be formed by an epitaxial crystal growth method or another method. The same applies to other embodiments according to the present invention.

The mask material layers 14a to 14d illustrated in FIGS. 5AA to 5AC may be formed of other material layers containing an organic material or an inorganic material, for example, SiO$_2$ layers, aluminum oxide (also referred to Al$_2$O$_3$ or AlO) layers, or SiN layers and may each be formed of a single layer or a plurality of layers as long as the material is suitable for the object of the present invention. The same applies to other embodiments according to the present invention.

The thicknesses and the shapes of the mask material layers 14a to 14d illustrated in FIGS. 5AA to 5AC are changed by polishing by CMP, RIE etching, and washing. This change may cause no problem as long as the degree of the change is within a suitable range for the object of the present invention. The same applies to other embodiments according to the present invention.

In the first embodiment, the TiN layers 18a and 18b are used as the plate line PL and the gate conductor layer 5a connected to the plate line PL. In contrast, a single or a plurality of conductor material layers may be used in combination instead of the TiN layers 18a and 18b. Similarly, the TiN layers 26a and 26b are used as the word line WL and the gate conductor layer 5b connected to the word line WL. In contrast, a single or a plurality of conductor material layers may be used in combination instead of the TiN layers 26a and 26b. The same applies to other embodiments according to the present invention.

The SiN layers 21a and 21b illustrated in FIGS. 5DA to 5DC, the SiO$_2$ layers 20a and 20b illustrated in FIGS. 5EA to 5EC, and the SiN layers 27a and 27b illustrated in FIGS. 5GA to 5GC are etching mask layers for forming the TiN layers 18a, 18b, 26a, and 26b. The SiN layers 21a, 21b, 27a, and 27b and the SiO$_2$ layers 20a and 20b may be other material layers each formed of a single layer or a plurality of layers as long as the function of the etching mask in the embodiment is obtained. The same applies to other embodiments according to the present invention.

In the second embodiment, the HfO$_2$ layers 17a and 33 that function as gate insulating layers are formed as the gate insulating layers so as to surround the Si pillars 12a to 12d. The gate insulating layers may each be another material layer formed of a single layer or a plurality of layers. The same applies to other embodiments according to the present invention.

In the first embodiment, the Si pillars 12a to 12d have a circular shape in plan view. The Si pillars 12a to 12d may have, for example, a circular shape, an elliptical shape, or a shape elongated in one direction in plan view. Also in a logic circuit region formed apart from the dynamic flash memory cell region, Si pillars having different shapes in plan view may be mixed and formed depending on the logic circuit design. The same applies to other embodiments according to the present invention.

In FIG. 1, the first gate conductor layer 5a may be divided into two or more portions, and the portions may be operated as conductor electrodes for the plate line synchronously or asynchronously at the same drive voltage or different drive voltages. Similarly, the second gate conductor layer 5b may be divided into two or more portions, and the portions may be operated as conductor electrodes for the word line synchronously or asynchronously at the same drive voltage or different drive voltages. This also enables the dynamic flash memory operations to be performed. In this case, in FIGS. 5DA to 5DC and FIGS. 5EA to 5EC, through the etching of the TiN layer 18, in plan view, the TiN layer 18 surrounding the Si pillars 12a and 12b is formed to be divided into two TiN layers in the direction of line Y-Y', and the TiN layer 18 surrounding the Si pillars 12c and 12d is formed to be divided into two TiN layers in the direction of line Y-Y'. In this case, the TiN layer may be formed to extend between the Si pillars 12a and 12b and the Si pillars 12c and 12d in plan view. Similarly, in FIGS. 5GA to 5GC, each of the TiN layers 26a and 26b may be formed in a divided manner. The same applies to other embodiments according to the present invention.

In FIG. 1, the first gate conductor layer 5a is connected to the plate line PL, and the second gate conductor layer 5b is connected to the word line WL. Alternatively, the second gate conductor layer 5b may be connected to the plate line PL, and the first gate conductor layer 5a may be connected to the word line WL, as described above. The same applies to other embodiments according to the present invention.

In FIGS. 5AA to 5JC, the N$^+$ layer 11a is formed to be continuous in bottom portions of the Si pillars 12a to 12d. In contrast, a conductor layer made of, for example, tungsten (W) may be provided on outer peripheral portions of the Si pillars 12a to 12d so as to be connected to the N$^+$ layer 11a in plan view.

In FIGS. 5AA to 5JC, the N$^+$ layer 11a is formed to be continuous in bottom portions of the Si pillars 12a to 12d. In this case, the source line SL connected to each of the Si pillar 12a to 12d is common. In contrast, for example, the N$^+$ layers between the Si pillars 12a and 12b and between the Si pillars 12c and 12d may be electrically isolated by shallow trench isolation (STI) or using a well structure. In this case, it is necessary to provide a low-resistance conductor layer in contact with each of the isolated N$^+$ layers. As a result, the N$^+$ layers connected to isolated source lines can be each independently driven.

In the first embodiment and the second embodiment, a negative bias is applied to the source line SL at the time of an erase operation to draw out the group of positive holes in the channel region 7 which is a floating body FB. Alternatively, instead of applying a negative bias to the source line SL, a negative bias may be applied to the bit line BL or a negative bias may be applied to the source line SL and the bit line BL to perform an erase operation. Alternatively, 0 V may be applied to the source line SL, and a negative bias may be applied to the bit line BL to perform an erase operation. The same applies to other embodiments according to the present invention.

In the operations described with reference to FIGS. 2A to 2C, FIGS. 3A to 3C, and FIGS. 4AA to 4BG, a fixed voltage of, for example, 2 V may be applied as the voltage $V_{ErasePL}$ of the plate line PL regardless of the operation mode. Alternatively, for example, 0 V may be applied as the voltage $V_{ErasePL}$ of the plate line PL only at the time of erasing.

It is to be understood that various embodiments and modifications of the present invention are possible without departing from the broad spirit and scope of the present invention. The embodiments described above are illustrative examples of the present invention and do not limit the scope of the present invention. The embodiments and modifications can be appropriately combined. Furthermore, some of constituent features of the above embodiments may be omitted as required, and such embodiments still fall within the technical idea of the present invention.

According to the method for manufacturing an SGT-including memory device according to the present invention, a high-density and high-performance dynamic flash memory which is an SGT-including memory device can be obtained.

What is claimed is:

1. A method for manufacturing a pillar-shaped semiconductor element-including memory device that controls voltages applied to a first gate conductor layer, a second gate conductor layer, a third gate conductor layer, a fourth gate conductor layer, a first impurity region, and a second impurity region to perform a data write operation, a data read operation, and a data erase operation, the method comprising the steps of:

forming a first semiconductor pillar and a second semiconductor pillar standing on a substrate in a vertical direction and disposed adjacent to each other in a first direction in plan view, and a third semiconductor pillar and a fourth semiconductor pillar standing on the substrate in the vertical direction, having centers on a second line parallel to a first line passing through centers of the first semiconductor pillar and the second semiconductor pillar, and disposed adjacent to each other;

forming a first gate insulating layer surrounding lower portions of the first to fourth semiconductor pillars and a second gate insulating layer surrounding upper portions of the first to fourth semiconductor pillars, a first gate conductor layer that surrounds the first gate insulating layer surrounding the first semiconductor pillar and the second semiconductor pillar and that extends between the first semiconductor pillar and the second semiconductor pillar, a second gate conductor layer that surrounds the first gate insulating layer surrounding the third semiconductor pillar and the fourth semiconductor pillar and that extends between the third semiconductor pillar and the fourth semiconductor pillar, a third gate conductor layer that surrounds the second gate insulating layer surrounding the first semiconductor pillar and the second semiconductor pillar and that extends between the first semiconductor pillar and the second semiconductor pillar, and a fourth gate conductor layer that surrounds the second gate insulating layer surrounding the third semiconductor pillar and the fourth semiconductor pillar and that extends between the third semiconductor pillar and the fourth semiconductor pillar;

before or after the forming of the first to fourth semiconductor pillars, forming the first impurity region connected to bottom portions of the first to fourth semiconductor pillars;

before or after the forming of the first to fourth semiconductor pillars, forming the second impurity region in a top portion of each of the first to fourth semiconductor pillars; and forming a first wiring conductor layer connected to the second impurity region of each of the top portions of the first semiconductor pillar and the third semiconductor pillar, and a second wiring conductor layer connected to the second impurity region of each of the top portions of the second semiconductor pillar and the fourth semiconductor pillar.

2. The method for manufacturing a pillar-shaped semiconductor element-including memory device according to claim 1, wherein, in plan view, a first length is smaller than a second length, where the first length represents a distance between two opposed points among points where two outer circumferential lines of the first gate insulating layers surrounding the first semiconductor pillar and the second semiconductor pillar intersect the first line joining the centers of the first semiconductor pillar and the second semiconductor pillar, and the second length represents a distance between two opposed points among points where two outer circumferential lines of the first gate insulating layers surrounding the first semiconductor pillar and the third semiconductor pillar intersect a third line joining the centers of the first semiconductor pillar and the third semiconductor pillar, the second length is larger than twice a third length, where the third length represents a thickness of the first gate conductor layer surrounding the first semiconductor pillar on the third line, and the first length is smaller than twice the third length.

3. The method for manufacturing a pillar-shaped semiconductor element-including memory device according to claim 1, comprising the steps of:

after the forming of the first gate insulating layer, forming, on an outer peripheral portion of the first gate insulating layer, a first conductor layer having an upper surface whose level corresponds to upper ends of the first gate conductor layer and the second gate conductor layer in the vertical direction;

forming a first mask material layer disposed on the top portion of each of the first to fourth semiconductor pillars, a second mask material layer extending between the first semiconductor pillar and the second semiconductor pillar, and a third mask material layer extending between the third semiconductor pillar and the fourth semiconductor pillar and separated from the second mask material layer, the second and third mask material layers surrounding side surfaces of the first to fourth semiconductor pillars; and etching the first conductor layer using the first mask material layer, the second mask material layer, and the third mask material layer as a mask to form the first gate conductor layer and the second gate conductor layer.

4. The method for manufacturing a pillar-shaped semiconductor element-including memory device according to claim 1, comprising the steps of:

after the forming of the second gate insulating layer, forming, on an outer peripheral portion of the second gate insulating layer, a second conductor layer having an upper surface whose level is located near a lower end of the second impurity region in the vertical direction;

forming a first mask material layer disposed on each of the top portions of the first to fourth semiconductor pillars, a fourth mask material layer extending between the first semiconductor pillar and the second semiconductor pillar, and a fifth mask material layer extending between the third semiconductor pillar and the fourth semiconductor pillar, the fourth and fifth mask material layers being disposed on the second conductor layer, surrounding a side surface of the first mask material layer and side surfaces of the first to fourth semiconductor pillars, and being separated from each other; and etching the second conductor layer using the first mask material layer, the fourth mask material layer, and the fifth mask material layer as a mask to form the third gate conductor layer and the fourth gate conductor layer.

5. The method for manufacturing a pillar-shaped semiconductor element-including memory device according to claim 1, comprising the steps of:

after the forming of the first gate insulating layer, forming, on an outer peripheral portion of the first gate insulating layer, a third conductor layer having an upper surface whose level corresponds to upper ends of the first gate conductor layer and the second gate conductor layer in the vertical direction;

forming a second insulating layer on the third conductor layer;

forming, on the second insulating layer, a fourth conductor layer having an upper surface whose level is close to a lower end of the second impurity region in the vertical direction, forming a first mask material layer disposed on each of the top portions of the first to fourth semiconductor pillars, a sixth mask material layer extending between the first semiconductor pillar and the second semiconductor pillar, and a seventh mask material layer extending between the third semiconductor pillar and the fourth semiconductor pillar, the sixth and seventh mask material layers being disposed on the fourth conductor layer, surrounding a side surface of the first mask material layer and side surfaces of the first to fourth semiconductor pillars, and being separated from each other; and etching the third conductor layer, the second insulating layer, and the fourth conductor layer using the first mask material layer, the sixth mask material layer, and the seventh mask material layer as a mask to form the first gate conductor layer, the second gate conductor layer, the third gate conductor layer, and the fourth gate conductor layer.

6. The method for manufacturing a pillar-shaped semiconductor element-including memory device according to claim 1, wherein the memory device is formed such that a wiring line connected to the first impurity region is a source line, a wiring line connected to the second impurity region is a bit line, and one of a wiring line connected to the first gate conductor layer and the second gate conductor layer and a wiring line connected to the third gate conductor layer and the fourth gate conductor layer is a word line and the other is a first driving control line, and voltages are applied to the source line, the bit line, the first driving control line, and the word line to selectively perform the data erase operation and the data write operation.

7. The method for manufacturing a pillar-shaped semiconductor element-including memory device according to claim 1,
wherein the memory device is formed such that a first gate capacitance between the first gate conductor layer and the first to fourth semiconductor pillars is larger than a second gate capacitance between the second gate conductor layer and the first to fourth semiconductor pillars.

8. The method for manufacturing a pillar-shaped semiconductor element-including memory device according to claim 1, comprising:
forming first holes between the third gate conductor layer and the fourth gate conductor layer in plan view.

9. The method for manufacturing a pillar-shaped semiconductor element-including memory device according to claim 1, comprising:
forming second holes between the first wiring conductor layer and the second wiring conductor layer.

10. The method for manufacturing a pillar-shaped semiconductor element-including memory device according to claim 5,
wherein the second insulating layer is formed from the second gate insulating layer connected to the first to fourth semiconductor pillars.

11. The method for manufacturing a pillar-shaped semiconductor element-including memory device according to claim 1, comprising a step of:
oxidizing upper surfaces or upper surfaces and side surfaces of the first gate conductor layer and the second gate conductor layer.

12. The method for manufacturing a pillar-shaped semiconductor element-including memory device according to claim 5, comprising:
after the etching of the third conductor layer, the second insulating layer, and the fourth conductor layer using the first mask material layer, the sixth mask material layer, and the seventh mask material layer as a mask to form the first gate conductor layer, the second gate conductor layer, the third gate conductor layer, and the fourth gate conductor layer, forming third holes between the first and third gate conductor layers and the second and fourth gate conductor layers.

13. The method for manufacturing a pillar-shaped semiconductor element-including memory device according to claim 5,
wherein the second insulating layer is formed from the second gate insulating layer surrounding the first to fourth semiconductor pillars and connected to the top of the third conductor layer.

14. The method for manufacturing a pillar-shaped semiconductor element-including memory device according to claim 1, comprising:
the data write operation of retaining, inside any or all of the first to fourth semiconductor pillars, a group of positive holes formed by an impact ionization phenomenon or a gate-induced drain leakage current by controlling voltages applied to the first gate conductor layer, the second gate conductor layer, the third gate conductor layer, the fourth gate conductor layer, the first impurity region, and the second impurity region; and the data erase operation of discharging the group of positive holes from the inside of any or all of the first to fourth semiconductor pillars by controlling voltages applied to the first gate conductor layer, the second gate conductor layer, the third gate conductor layer, the fourth gate conductor layer, the first impurity region, and the second impurity region.

* * * * *